(12) United States Patent
Wu et al.

(10) Patent No.: US 8,749,322 B2
(45) Date of Patent: Jun. 10, 2014

(54) MULTILAYER CIRCUIT BOARD STRUCTURE AND CIRCUITRY THEREOF

(75) Inventors: Tzong-Lin Wu, Taipei (TW); Chuen-De Wang, Taipei (TW)

(73) Assignee: National Taiwan University, Taipei (TW)

( * ) Notice: Subject to any disclaimer, the term of this patent is extended or adjusted under 35 U.S.C. 154(b) by 409 days.

(21) Appl. No.: 13/224,501

(22) Filed: Sep. 2, 2011

(65) Prior Publication Data
US 2013/0057362 A1    Mar. 7, 2013

(51) Int. Cl.
*H01P 3/08* (2006.01)
(52) U.S. Cl.
USPC ............................ 333/204; 333/219; 333/185
(58) Field of Classification Search
USPC ........................ 333/185, 204, 202, 205, 219
See application file for complete search history.

(56) References Cited

U.S. PATENT DOCUMENTS

2010/0108373 A1* 5/2010 Park .............................. 174/376

* cited by examiner

*Primary Examiner* — Robert Pascal
*Assistant Examiner* — Kimberly Glenn
(74) *Attorney, Agent, or Firm* — Rosenberg, Klein & Lee

(57) ABSTRACT

An exemplary embodiment of the present disclosure illustrates a multilayer circuit board structure, for suppressing the undesired electromagnetic wave propagation within a specific frequency band. The multilayer circuit board structure includes a plurality of crystals and a plurality of conducting channels, wherein a crystal includes a first through fourth conducting planes, at least a first conducting connector, and at least a second conducting connector, wherein the first through the fourth conducting planes are substantially parallel to each other. The first conducting plane is electrically connected to the third conducting plane through the first conducting connector. The fourth conducting plane is electrically connected to the second conducting plane through the second conducting connector. The first and the third conducting planes are configured to be electrically separated from the second and the fourth conducting planes. Furthermore, the conducting channels are for electrically connecting between crystals in the multilayer circuit board structure.

17 Claims, 21 Drawing Sheets

MULTILAYER CIRCUIT BOARD STRUCTURE AND CIRCUITRY THEREOF

BACKGROUND

1. Technical Field

The present disclosure relates to a multilayer circuit board structure, in particular, to a multilayer circuit board structure adapted to suppress the undesired electromagnetic wave propagation within a specific frequency band.

2. Description of Related Art

Recently, consumer electronic device developed rapidly toward miniaturization, leading in increasing demands of faster clock rate, low voltage level, and high system integration. Consequently, power integrity circuit design becomes a major challenge in maintaining the stability of a system. Electromagnetic noise such as simultaneously switching noise (SSN) or ground bounced noise (GBN) will be induced as the transient switching current of the digital transistors flows through the parasitics of the power distribution network (PDN), as the result the output signal of the radio frequency (RF) circuit become severely distorted, and thereby effecting the stability of the operating system.

Recently, as illustrated in FIG. 1, a high impedance surface (HIS) electromagnetic bandgap (EBG) structure 10 has developed as a possible solution for mitigating SSN coupling noise on parallel power planes. The HIS EBG structure 10 is designed to mitigate the coupling electromagnetic noise within the desired bandgap above gigahertz range, so as to suppress the electromagnetic wave propagation of the undesired electromagnetic wave omni-directionally. Please refer to FIG. 1 in conjunction with FIG. 2, which provides a side view diagram of a HIS EBG structure. The HIS EBG structure 10 has a structure consisting of a plurality of mushroom shaped structure crystals 12. The plurality of mushroom shaped EBG structure crystals 12 are disposed periodically, and each of the mushroom shaped EBG structure crystals 12 has a via 140, an inner metallic conducting patch 120, a partition of the first outer metallic conducting plane 110, and a partition of the second outer metallic conducting plane 130. The inner metallic conducting patch 120 is connected to the partition of the second outer metallic conducting plane 130 through the via 140. The inner metallic conducting patch 120 and the via 140 are disposed between the first outer metallic conducting plane 110 and the second outer metallic conducting plane 130.

Further, a first and a second dielectric layers (not shown) are interposed between the first outer metallic conducting plane 110 and the inner metallic conducting patches 120, and between the inner metallic conducting patches 120 and the second outer metallic conducting plane 130. Consequently, the stack of the partition of the first outer metallic conducting plane 110, the inner metallic conducting patch 120, and the partition of the second outer metallic conducting plane 130 form a capacitive element. The capacitive element is connected in series with an inductive element formed by the via 140, and the HIS EBG structure 10 thereby functions as a band stop filter. The bandwidth parameters (such as an upper and a lower cutoff frequency) are therefore associated with the geometric parameters of the HIS EBG structure 10.

For instance, the side length of the partition of the first and the second outer metallic conducting planes 110, 130 is 4 mm (i.e. a=4 mm), the side length of the inner metallic conducting patch 120 is 3.8 mm (i.e. p=3.8 mm), and the radius of the via 140 is 37.5 μm. The separation between the partition of the first outer metallic conducting plane 110 and the inner metallic conducting patch 120 is 45 μm (i.e. h=45 μm), and the separation between the inner metallic conducting patch 120 and the partition of the second outer metallic conducting plane 130 is 90 μm. A corresponding dispersion diagram is depicted in FIG. 3, wherein a dispersion diagram generally describes the propagation of the electromagnetic wave over a set frequency range. The frequency bandgap in the presented example is from 3.05 GHz to 5.85 GHz, i.e., the energy gap between a first mode electromagnetic transmission curve C12 and a second mode electromagnetic transmission curve C14.

Despite that the HIS EBG structure 10 may effectively suppress the SSN noise within a desire band, the HIS EBG structure 10 as described does not yield broad stop band bandwidth. Further as shown in FIG. 1, the HIS EBG structure 10 requires large area occupation, and consequently might not be the most optimum solution to be adopted in the power integrity design for electromagnetic noise suppression.

SUMMARY

An exemplary embodiment of the present disclosure illustrates a multilayer circuit board structure, for suppressing the undesired electromagnetic wave propagation within a specific frequency band. The multilayer circuit board structure includes a plurality of crystals and a plurality of conducting channels, wherein a crystal includes a first through fourth conducting planes, at least a first conducting connector, and at least a second conducting connector, wherein the first through the fourth conducting planes are substantially parallel to each other. The first conducting plane is electrically connected to the third conducting plane through the first conducting connector. The fourth conducting plane is electrically connected to the second conducting plane through the second conducting connector. The first and the third conducting planes are configured to be electrically separated from the second and the fourth conducting planes. Furthermore, at least one of the first and the third conducting planes associated with a crystal is electrically connected to at least one of the first and the third conducting planes associated with at least one adjacent crystal through at least one of the conducting channels. Similarly, at least one of the second and the fourth conducting planes associated with the crystal is electrically connected to at least one of the second and the fourth conducting planes associated with at least one of the adjacent crystal through at least one of the conducting channels.

An exemplary embodiment of the present disclosure provides an equivalent parallel plate transmission line circuit in accordance to a crystal of a multilayer circuit board structure and conducting channels adjacent to the crystal. The equivalent parallel plate transmission line circuit includes a first pair of parallel plate transmission lines, a second pair of parallel plate transmission lines, and a third pair of parallel plate transmission lines. Each of the first through third pairs of parallel plate transmission lines includes a first transmission line and a second transmission line, wherein the first and the second transmission lines further includes a plurality of impedance elements connected in series with each other. The first transmission line of the first pair of parallel plate transmission lines is electrically connected to the second transmission line of the second pair of parallel plate transmission lines through a first inductor, while the first transmission line of the second pair of parallel plate transmission lines is electrically connected to the second transmission line of the third pair of parallel plate transmission lines through a second inductor. Moreover, the second transmission line of the first pair of parallel plate transmission lines is electrically shorted to the first transmission line of the second pair of parallel plate transmission lines. Similarly, the second transmission line of the second pair of parallel plate transmission lines is electrically shorted to the first transmission line of the third pair of parallel plate transmission lines. The disclosed equivalent parallel plate transmission line circuit ultimately forming an inductor-capacitor (L-C) resonance circuit which can function as a band stop filter for suppressing electromagnetic wave propagations in a desired frequency band.

To sum up, a multilayer circuit board structure is illustrated by the present disclosure may be adapted for suppressing the undesired electromagnetic wave propagation within a specific frequency band. The geometric properties of the multilayer circuit board structure may be configured to generate a specific stop band bandwidth. In addition, the disclosed multilayer circuit board structure provides wider bandgap than the conventional mushroom shaped EBG structure while occupies smaller area thereby be a more cost-effective electromagnetic noise isolation solution. Hence the multilayer circuit board structure may be utilized to effectively block simultaneous switching noise (SSN) on the parallel power planes when incorporated onto a PCB board or a multilayer package substrate design.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 2:
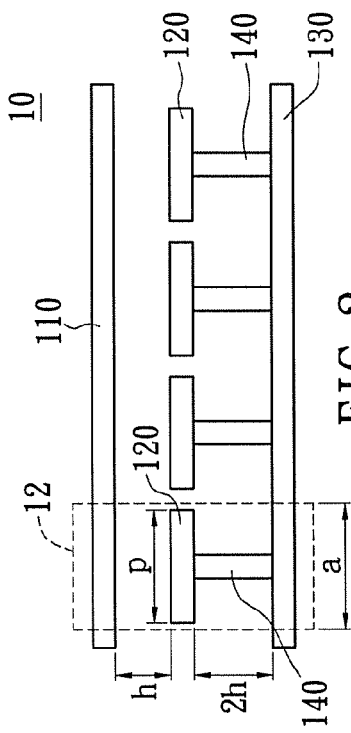
FIG. 2 is a side view diagram of a HIS EBG structure.
Figure 1:
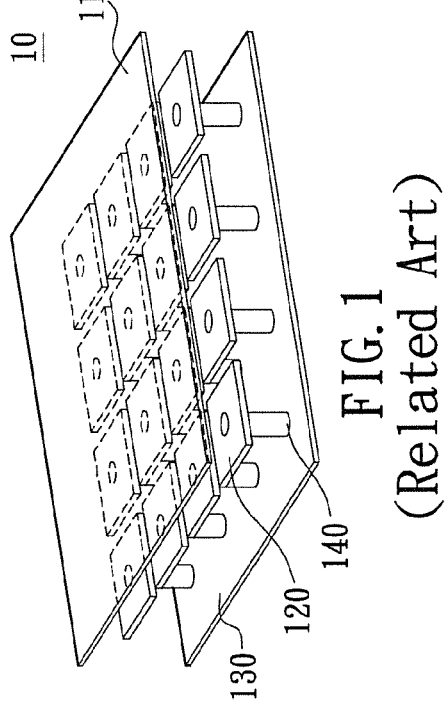
FIG. 1 is a three-dimensional diagram of a HIS EBG structure.
Figure 3:
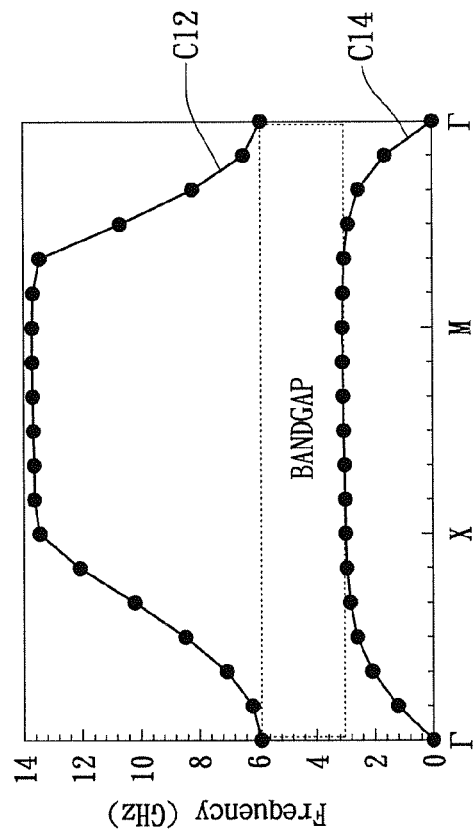
FIG. 3 is a dispersion diagram of a HIS EBG structure.

Reference will now be made in detail to the exemplary embodiments of the present disclosure, examples of which are illustrated in the accompanying drawings. Wherever possible, the same reference numbers are used in the drawings and the description to refer to the same or like parts.

(An Exemplary Embodiment of a Multilayer Circuit Board Structure)

Figure 4:
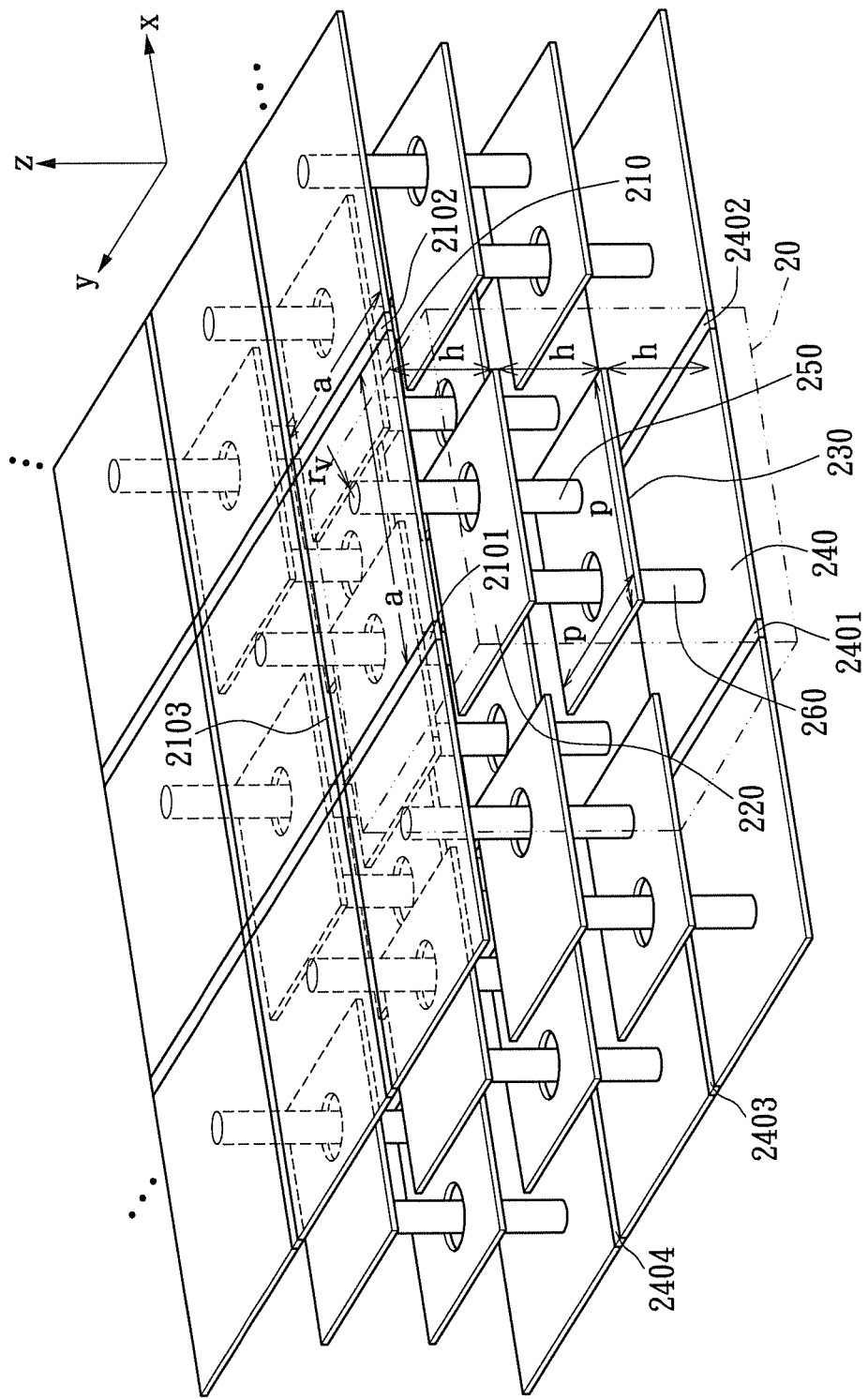
FIG. 4 is a three-dimensional diagram a multilayer circuit board structure in accordance to one exemplary embodiment of the present disclosure.
Figure 5:
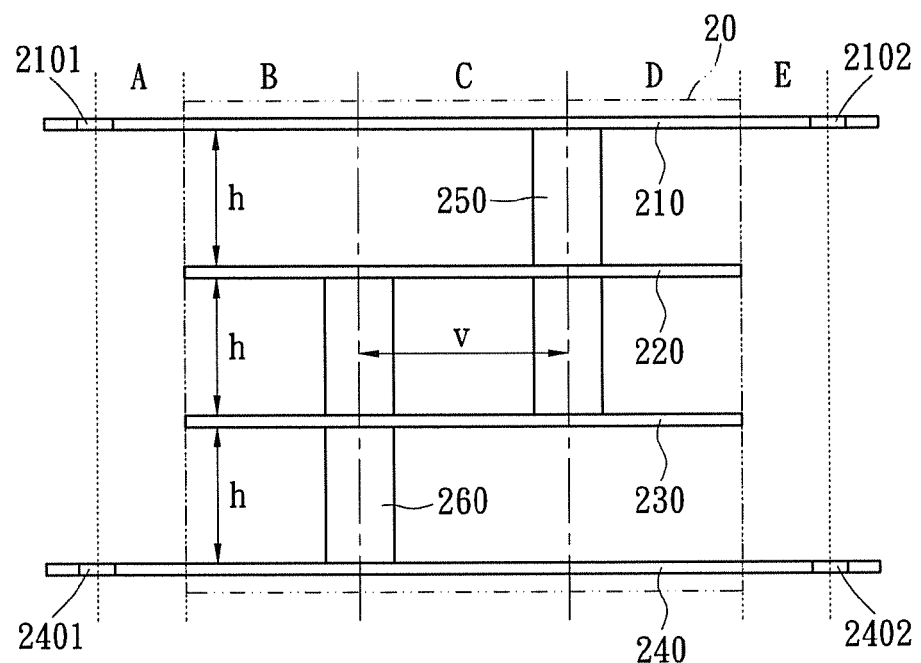
FIG. 5 is a side view diagram of a multilayer circuit board structure in accordance to one exemplary embodiment of the present disclosure.

Please refer to FIG. 4 in conjunction with FIG. 5 which respectively illustrates a three-dimensional view and a side view for a multilayer circuit board structure in accordance to the instant exemplary embodiment of the present disclosure.

The multilayer circuit board structure may be utilized to suppress propagation of the undesired electromagnetic wave within a specific frequency band. The multilayer circuit board structure disclosed in the instant embodiment includes a plurality of crystals 20 distributed periodically with a spacing and a plurality of conducting channels 2101, 2102, 2103, 2401, 2402, 2403, 2404 forming a two-dimensional crystal lattice array as shown in FIG. 4. In which, each crystal 20 in the multilayer circuit board may be uniformly spaced. As depicted in FIG. 4 and FIG. 5, a crystal 20 includes a plurality of conducting planes 210, 220, 230, 240 and a plurality of conducting connectors 250, 260. As described above, since the crystals 20 are arranged periodically to form the multilayer circuit board structure, with each crystal being electrically connected through at least one of the plurality conducting channels 2101, 2102, 2103, 2401, 2402, 2403, 2404 disposed between the conducting planes located in the crystals 20.

Furthermore, the conducting planes 210, 240 may respectively be the first and the second outer metallic conducting planes, the conducting planes 220, 230 may respectively be the first and the second inner metallic conducting patches, and the conducting connectors 250, 260 may respectively be the first and the second metallic conducting connectors. The plurality of conducting channels 2101, 2102, 2103, 2401, 2402, 2403, 2404 may be conducting plates or metal strips disposed to seal the coplanar gaps between the conducting planes 210, 240 of the crystals 20. However, the types of manufacturing materials and implementation methods selected for the conducting planes 210, 220, 230, 240, the conducting connectors 250, 260, or the conducting channels 2101, 2102, 2103, 2401, 2402, 2403, 2404 shall not be used to limit the instant disclosure.

As illustrated in FIG. 4 and FIG. 5, the conducting planes 220, 230 are embedded between the conducting plane 210 and the conducting plane 240. To be more specific, the conducting plane 220 is disposed between the conducting plane 210 and the conducting plane 230. The conducting plane 230 is disposed between the conducting plane 220 and the conducting plane 240. Moreover, the conducting plane 220 is disposed substantially parallel to the conducting plane 210 and the conducting plane 240, and the conducting plane 230 is disposed substantially parallel to the conducting plane 220 and the conducting plane 240.

Furthermore, the conducting plane 210 is electrically connected to the conducting plane 230 through the conducting connector 250. The conducting plane 240 is electrically connected to the conducting plane 220 through the conducting connector 260. Specifically, one end of the conducting connector 250 is electrically connected to the conducting plane 210 and the other end of the conducting connector 250 through a hole on the conducting plane 220 to electrically connect the conducting plane 230. Similarly, one end of the conducting connector 260 is electrically connected to the conducting plane 240, and the other end of the conducting connector 260 through a hole on the conducting plane 230 to electrically connect the conducting plane 220. Equivalently, the conducting plane 220 and the conducting plane 230 are arranged to alternatively distributing in the vertical direction through the conducting connectors 250 and the conducting connector 260, respectively. The conducting connector 250 and the conducting connector 260 may be substantially anchored at the center of the conducting plane 230 and the conducting plane 220, respectively to maintain structural symmetry for each crystal 20.

Nevertheless, the conducting connector 250 and the conducting connector 260 are configured to be electrically isolated from each other. Consequently, the conducting plane 210 and the conducting plane 230 are electrically separated from the conducting plane 220 and the conducting plane 240.

Moreover, the conducting plane 210 of the crystal 20 through at least one of the conducting channels 2101, 2102, 2103 electrically connects to the conducting planes 210 located in the adjacent crystals 20. Similarly, the conducting plane 240 of the crystal 20 through at least one of the conducting channels 2401, 2402, 2403, 2404 electrically connects to the conducting planes 240 located in the adjacent crystals 20.

In particular, as illustrated in FIG. 4, the conducting plane 210 and the conducting plane 240 of the crystal 20 may through at least one of the conducting channels 2101, 2102, 2103, 2401, 2402, 2403, 2404 (e.g., which may be conducting plates, disposed between the coplanar conducting planes 210, 240 of the crystals 20) electrically connect to the coplanar conducting planes 210, 240 located in the adjacent crystals 20.

For instance, the conducting channels 2101, 2102 may electrically connect the conducting plane 210 of the crystal 20 and the coplanar conducting planes 210 of the adjacent horizontally oriented (e.g., oriented in the x-direction) crystals 20 thereby establish an electrical plane connection between the conducting planes 210 of the corresponding crystals 20. Alternatively, the conducting channel 2103 may electrically connect the conducting plane 210 of the crystal 20 and a coplanar conducting plane 210 of an adjacent vertically oriented (e.g., oriented in the y-direction) crystal 20 thereby establish an electrical plane connection between conducting planes 210 of the corresponding crystals 20. Likewise, the conducting channels 2401, 2402 may electrically connect the conducting plane 240 of the crystal 20 and the coplanar conducting planes 240 of the adjacent horizontally oriented (e.g., oriented in the x-direction) crystals 20 thereby establish an electrical plane connection between the conducting planes 210 of the corresponding crystals 20. The conducting channels 2403, 2404 may electrically connect the conducting plane 240 of the crystal 20 and the coplanar conducting planes 240 of the adjacent vertically oriented (e.g., oriented in the x-direction) crystals 20 thereby establish an electrical plane connection between the conducting planes 240 of the corresponding crystals 20.

Alternatively, the conducting channels 2101, 2102, 2103 may seal the coplanar gap between the conducting planes 210 of the periodically disposed crystals 20 to establish a Type A electrical plane network (e.g., a power plane network or a ground plane network). Similarly, the conducting channels 2401, 2402, 2403, 2404 may seal the coplanar gap between the conducting planes 240 of the periodically disposed crystals 20 to establish a Type B electrical plane network (e.g., a ground plane network or a power plane network). In which, the Type A electrical plane network may be at different electrical level from the Type B electrical plane network.

For instance, the Type A electrical plane network may be a power plane network while the Type B electrical plane network may be a ground plane network. However, the actual electrical levels assigned to the Type A and the Type B electrical plane networks are subject to the multilayer circuit board design and/or application requirements and the present disclosure is not limited thereto.

It is worth to note that, the conducting channels 2101, 2102, 2103, 2401, 2402, 2403, 2404 in the instant embodiment may be individually disposed on the side of the conducting planes 210, 240 between the crystals 20. However, the conducting channels 2101, 2102, 2103, 2401, 2402, 2403, 2404 may also be disposed on the side of the conducting planes 220, 230 to electrically connect the conducting planes 220, 230 of the crystal 20 to the adjacent horizontally and/or vertically oriented crystals 20. Further, it may be noted that a conducting plane of a crystal 20 may through at least one of the conducting channels 2101, 2102, 2103, 2401, 2402, 2403, 2404 electrically connect to any conducting planes of the same electrical level located in the adjacent crystals 20.

For instance, the conducting plane 210 of a crystal 20 may through at least one of the conducting channels 2101, 2102, 2103, 2401, 2402, 2403, 2404 electrically connects to the conducting plane 230 located in the adjacent crystals. Similarly, the conducting plane 240 of the crystal 20 may through at least one of the conducting channels 2101, 2102, 2103, 2401, 2402, 2403, 2404 electrically connects to the conducting plane 220 located in the adjacent crystals 20.

In principle, at least one of the conducting planes 210, 230 associated with the crystal 20 is electrically connect to at least one of the conducting planes 210, 230 associated with at least one adjacent crystal 20 through at least one of the conducting channels 2101, 2102, 2103, 2401, 2402, 2403, 2404 and at least one of the conducting planes 220, 240 associated with the crystal 20 is electrically connected to at least one of the conducting planes 220, 240 associated with at least one adjacent crystal 20 through at least one of the conducting channels 2101, 2102, 2103, 2401, 2402, 2403, 2404.

Moreover, the conducting channels 2101, 2102, 2103, 2401, 2402, 2403, 2404 may be implemented using wire, conducting plates and etc. Furthermore, the conducting channels 2101, 2102, 2103, 2401, 2402, 2403, 2404 may also be take on different shapes or dimensions in accordance to the design and/or fabrication requirements associated with the multilayer circuit board structure. Or equivalently, the geometric configurations of the conducting channels 2101, 2102, 2103, 2401, 2402, 2403, 2404 may be selected in accordance to the design requirement of a multilayer circuit board structure and is not limited by the instant disclosure.

Additionally, dielectric substrates (not shown) are interposed between adjacent conducting planes with a specific relative permittivity. Consequently, when electromagnetic waves excite into the crystal 20 of the instantly disclosed multilayer circuit board structure, the conducting plane 210 becomes capacitively coupled to the conducting plane 220. The conducting plane 220 becomes capacitively coupled to the conducting plane 230. The conducting plane 230 becomes capacitively coupled to the conducting plane 240.

In particular, the conducting planes 210, 240 as shown in FIG. 4 are configured to be square shaped and with same outline dimensions which are described by a side length parameter a. Likewise, the conducting planes 220, 230 are also configured to be square shaped and with same outline dimensions, which are described by a side length parameter p. The separations between each adjacent conducting plane in a crystal 20 are described by a parameter h. Moreover, the conducting connector 250 and the conducting connector 260 are of same radius described by a radius parameter $r_v$. The conducting connectors 250, 260 further formed a pair of conducting connectors within each crystal 20 with a center to center pitch described by a parameter v. The conducting channels 2101, 2102, 2103, 2401, 2402, 2403, 2404 (FIG. 4) may have a length substantially the same as the side length of the connected conducting planes (i.e., conducting planes 210, 240) and the width substantially the same as the spacing disposed between each crystal 20.

It is known to those who are skilled in the art that the geometric configurations of the crystal 20 of the multilayer circuit board structure (e.g., parameter a, p, h, and v) and the spacing between each crystal 20 are closely related to frequency and bandwidth of a desired stop band. Further, the center to center pitch v between the conducting connectors 250, 260, the radius $r_v$ of the conducting connectors 250, 260 may be selected to vary the upper and lower cutoff frequencies of a stop band bandwidth. In other words, through varying the geometric parameters of each crystal 20 of the instantly disclosed multilayer circuit board structure, specific stop band bandwidths may be generated.

Incidentally, the crystal 20 may be implemented onto a printed circuit board (PCB) with the conducting planes 210, 240 being a power and a ground plane respectively. The conducting planes 220, 230 may be the embedded patches between the power and the ground planes, serve to alternately distribute the power and the ground planes respectively to establish a PDN. Consequently, the conducting connectors 250, 260 may each be implemented by a via or a wire, employed to connect the power or the ground plane to a desired embedded patch (i.e., the conducting planes 230, 240). The conducting channels 2101, 2102, 2103, 2401, 2402, 2403, 2404 may be implemented by metallic plates. However, the exact crystal structure configurations, the spacing between the each crystal, and the conducting channels implementations adopted may depend on a specific design and/or application requirements and shall not be limited to the examples disclosed by the instant embodiment.

Figure 6:
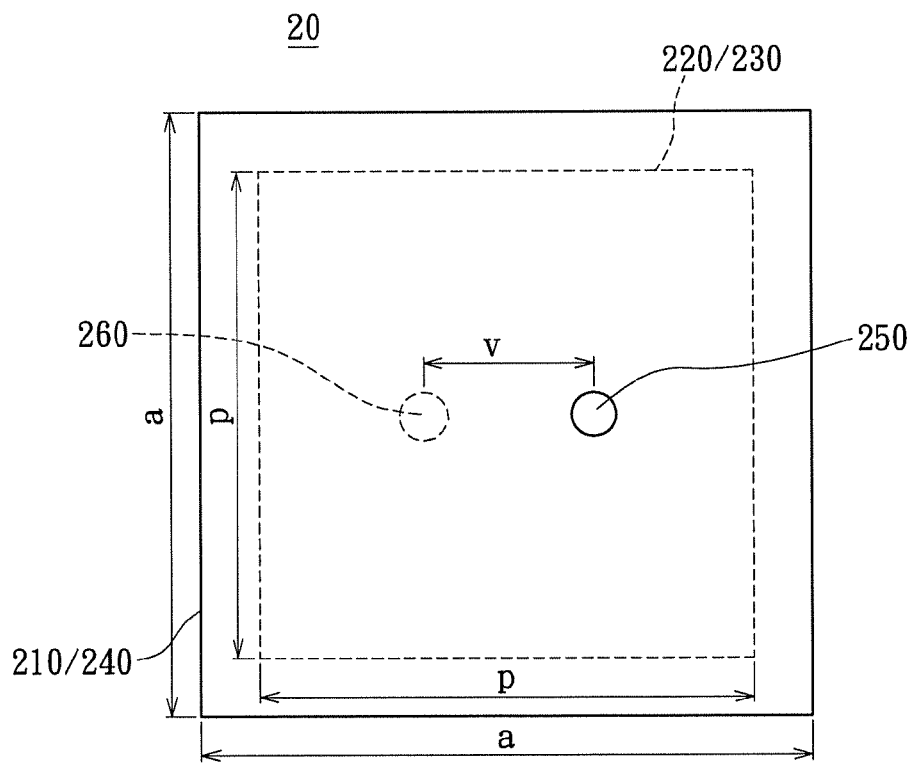
FIG. 6 is a top view diagram of a multilayer circuit board structure in accordance to one exemplary embodiment of the present disclosure.

Please refer to FIG. 6, which illustrates a top view diagram of a crystal 20 of a multilayer circuit board structure in accordance to one exemplary embodiment of the present disclosure. The outline shapes of the conducting planes 210, 240 are substantially enlarged from the outline shape of the conducting planes 220, 230. Correspondingly, the outline shapes of the conducting planes 220, 230 are substantially reduced from the outline shapes of the conducting planes 210, 240. For instance, as shown in FIG. 6, the side length parameter a for the conducting planes 210, 240 is substantially larger than the side length parameter p for the conducting planes 220, 230.

It is worth to note that crystals 20 in general may be configured to be different outline shapes, for example, the crystals 20 may each configured to be a square, a rectangle, a circle, an ellipse, a hexagon, a triangle, etc. The outline shape configurations may be selected in accordance to area occupancy efficiency, and should not be limited by the multilayer circuit board structure disclosed by the instant embodiment Moreover, the above described center to center pitch v between the conducting connector 250 and the conducting connector 260 may be configured to vary the desire stop band bandwidth parameters associated with the crystal 20. For instance, through reducing the center to center pitch v, the lower cutoff frequency may be shifted slightly toward lower band while the upper cutoff frequency may be shifted toward higher band. In other words, a wider stop band bandwidth may be generated if narrower center to center pitch v between the conducting connectors 250, 260 may be obtained. Similarly, the shapes or dimensions adopted for the conducting channels 2101, 2102, 2103, 2401, 2402, 2403, 2404 (not shown) may also be configured to vary the overall desired stop band bandwidth of the disclosed multilayer circuit board structure.

Figure 7:
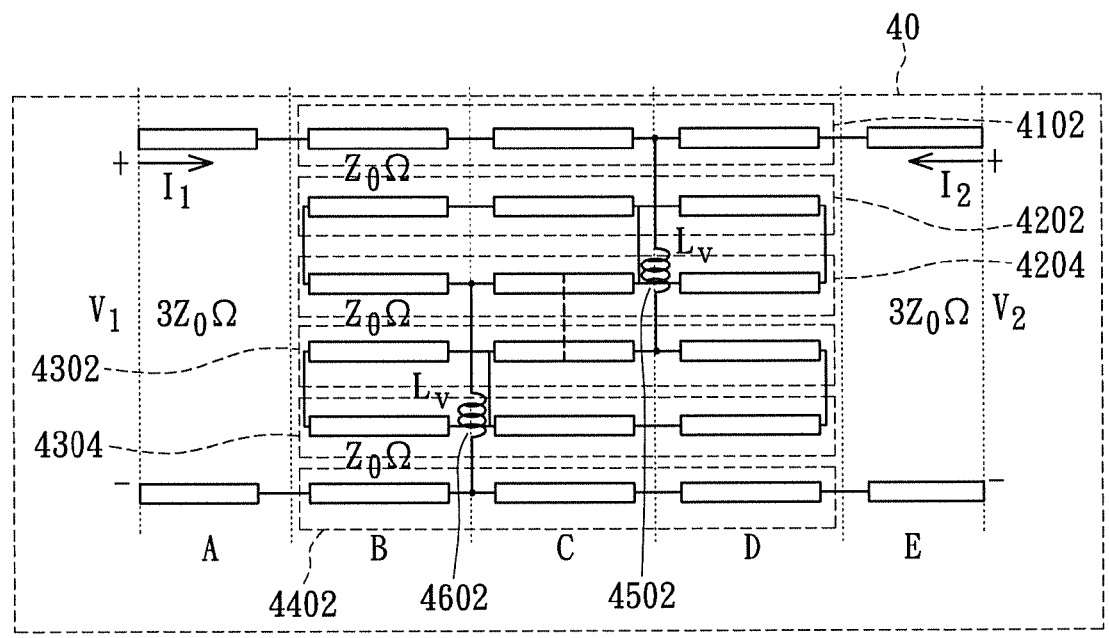
FIG. 7 is a circuit diagram of an equivalent parallel plate transmission line circuit for a crystal and the conducting channels adjacent to the crystal in a multilayer circuit board structure in accordance to an exemplary embodiment of the present disclosure.

Please refer to FIG. 7 concurrently with FIG. 5, which shows an equivalent parallel plate transmission line circuit 40 modeled for a crystal 20 and adjacent conducting channels of the multilayer circuit board structure in accordance to the instant disclosed exemplary embodiment of the present disclosure. The equivalent parallel plate transmission line circuit 40 functions as a band stop filter, suppressing the undesired electromagnetic wave propagation in a specific frequency band.

The disclosed equivalent parallel plate transmission line circuit 40 is modeled in accordance to a crystal 20 having four layers (i.e. the conducting planes 210, 220, 230, 240). The equivalent parallel plate transmission line circuit 40 includes three pairs of parallel plate transmission lines. The first pair of parallel plate transmission lines is formed by transmission lines 4102 and 4202. The second pair of parallel plate transmission lines is formed by transmission lines 4204 and 4302. The third pair of parallel plate transmission lines is formed by transmission lines 4304 and 4402. Furthermore, each pair of parallel plate transmission lines consisted of a plurality of impedance elements, generated as consequence of electromagnetic couplings between the adjacent conducting planes. The plurality of impedance elements may include at least one of resistance and reactance elements, wherein the reactance elements may be formed by the combinations of inductance and capacitance.

For further understandings, the equivalent parallel plate transmission line circuit 40 may be divided into five sections (i.e. A, B, C, D, and E) as shown in FIG. 7. Sections of the equivalent parallel plate transmission line circuit 40 (i.e., A, B, C, D, and E) are divided in accordance to the stack-up configurations of the crystal 20, the placements of the conducting connectors 250, 260, and the placements of the conducting channels 2101, 2102, 2401, 2402.

For instance, sections B, C, D are equivalent to the crystal 20 with each section modeled as above described three pairs of parallel plate transmission lines with individual characteristic impedance of $Z_0\Omega$, wherein the characteristic impedance of $Z_0\Omega$ may correspond to capacitively couplings formed by the adjacent conducting planes in each section. Since the crystal 20 is configured to be symmetrical with equal separations between the adjacent conducting planes denoted by parameter h, thus each pair of parallel plate transmission lines has identical characteristic impedance $Z_0\Omega$. Specifically, the first pair of parallel plate transmission lines (i.e., transmission line 4102 and 4202) with a series of characteristic impedance $Z_0\Omega$ elements is the result of capacitively coupling formed between the conducting plane 210 and the conducting plane 220 in each divided section. Likewise, the second pair of parallel plate transmission lines (i.e., transmission line 4204 and 4302) with a series of characteristic impedance $Z_0\Omega$ elements is the result of capacitively coupling formed between the conducting plane 220 and the conducting plane 230 in each divided section. Furthermore, the third pair of parallel plate transmission lines (i.e., transmission lines 4304 and 4402) with a series of characteristic impedance $Z_0\Omega$ elements is the result of capacitively coupling formed between the conducting plane 230 and the conducting plane 240 in each divided section.

Next, section A and E are divided as the result of having the outline dimensions of the conducting planes 210, 240 larger than the conducting planes 220, 230. Moreover, sections A and E may further model part of the electromagnetic coupling formed by the conducting channels 2101, 2102, 2401, 2402 between the conducting planes 210, 240 of the crystals 20. As illustrated in FIG. 5 and FIG. 7, the conducting channels 2101, 2102, 2401, 2402 may be conducting plates. Section A and E may represent transmission line sections which correspond to the capacitively coupling formed between the conducting planes 210, 240 of the crystal 20 as well as between the adjacent crystals through the conducting channels 2101, 2102, 2401, 2402. Since the separation between the conducting planes 210, 240 and the conducting channels 2101, 2102, 2401, 2402 as shown in FIG. 7 being 3 h, thereby having a characteristic impedance of $3Z_0\Omega$. As described previously, the types of conducting channels used for connecting between the conducting planes of the crystals 20 may vary according to the design and/or fabrication requirements of the multilayer circuit board structure. Consequently, the characteristic impedance modeling the sections A and E may change accord to the types of the conducting channels used and is not limited by the instant embodiment.

In addition, the conducting connectors 250, 260 are represented by inductors 4502, 4602, respectively in the equivalent parallel plate transmission line circuit 40. As depicted in FIG. 7, the inductor 4502 is configured to connect the transmission line 4102 to the transmission line 4302 in analogous to the conducting connector 250 connecting the conducting plane 210 to the conducting plane 230. Similarly, the inductor 4602 is configured to connect the transmission line 4402 to the transmission line 4204 in analogous to the conducting connector 260 connecting the conducting plane 240 to the conducting plane 220. The conducting connectors 250, 260 have identical geometric parameters (e.g. radius and length), due to the structure symmetry thereby having same parasitic inductance, denoted as $L_v$.

In an alternative view, the electrical configurations of the equivalent parallel plate transmission line circuit 40 in the instant embodiment may be further elaborated as follow. The transmission lines 4102 and 4402 have a plurality of impedance elements with characteristic impedances of $3Z_0\Omega$ and $Z_0\Omega$ accordingly, and the impedance elements of the transmission lines 4102, 4402 are connected in series to form a series circuitry, wherein the plurality of impedance elements aforementioned corresponds to the electromagnetic couplings between the adjacent conducting planes of each divided section (i.e., section A, B, C, D, and E). In other words, the impedance elements of sections A and E as described before correspond to the capacitively couplings between the conducting planes 210, 240 and the conducting channels 2101, 2102, 2401, 2402, thereby generating the characteristic impedance of $3Z_0\Omega$. The impedance elements of sections B, C, and D, correspond to the capacitively coupling between the conducing planes 210, 220 and between the conducing planes 230, 240, therefore generating the characteristic impedance of $Z_0\Omega$.

Further, transmission lines 4202 and 4204 are electrically identical as both modeled in accordance to the conducting plane 220 (i.e., upper and lower side of the conducting plane 220), and hence are electrically shorted together. Likewise, transmission lines 4302 and 4304 are electrically identical and modeled in accordance to the conducting plane 230 (i.e., upper and lower side of the conducting plane 230), and hence are electrically shorted together. In addition, transmission lines 4204 have a plurality of impedance elements with characteristic impedance $Z_0\Omega$ connecting in series forming a series circuitry, wherein the plurality of impedance elements correspond to the capacitively coupling between the conducting plane 220 and the conducting plane 230. Transmission lines 4304 have a plurality of impedance elements with characteristic impedance $Z_0\Omega$ connecting in series to form a series circuitry, wherein the plurality of impedance elements correspond to the capacitively coupling between the conducting plane 230 and the conducting plane 240. Moreover, transmission line 4102 is connected in series to transmission line 4302 through the inductor 4502, and transmission line 4204 is connected in series to transmission line 4402 through the inductor 4602. Inductors 4502 and 4602 as described above have the inductance denoted as $L_v$.

Consequently, the equivalent parallel plate transmission line circuit 40 disclosed has capacitive impedance elements connected in series with inductive elements, forming an L-C resonance circuitry and may utilized to function as a band stop filter. The capacitive impedance elements in particular described by the characterize impedance $Z_0\Omega$ as a consequence of capacitively couplings between the conducting planes and the conducting channels. The inductance $L_v$ is the inductance due to the current (i.e. $I_1$, $I_2$) flowing through the conducting connectors. Terminal $V_1$ and $V_2$ denote an input and an output voltage of the equivalent parallel plate transmission line circuit 40, respectively.

It is worth mentioning that FIG. 7 is only serving as an illustration of an exemplary equivalent parallel plate transmission line circuit for a crystal of a multilayer circuit board structure, and hence the type of electrical connections, circuit elements arrangements shown in FIG. 7, should not be limited by the present disclosure.

It is known to those skilled in art the resonance frequency is inversely proportional to the product of an equivalent capacitance and an equivalent inductance. The resonance bandwidth is proportional to the equivalent capacitance but inverse proportional to the equivalent inductance. Hence, it may be noted that by increasing the equivalent capacitance between the conducting planes 210, 240 (e.g., increases separations between the adjacent the conducting planes 210, 220, 230, 240), the stop band may be shifted toward the lower cutoff frequency, thereby broadening the bandwidth of the desired stop band. On the other hand, the upper cutoff frequency may be increased by varying placements of the conducting connectors 250, 260. Alternatively, by decreasing the center to center pitch between the conducting connectors 250, 260, the upper cutoff frequency may be shifted toward the higher frequency.

In addition, the corresponding lower and upper cutoff frequencies of the designed stop band bandwidth may be obtained theoretically through determining the two-port network impedance parameters of the equivalent parallel plate transmission line circuit 40. As the equivalent parallel plate transmission line circuit 40 has a rotational symmetry with respect to the symmetry interface of the crystal 20. The two-port network impedance parameters may for instance, be computed by using the even-odd mode excitation resonant circuit analysis. Those skilled in the art should be able to perform the two-port network impedance parameters analysis to determine the lower and the upper cutoff frequencies, and hence further descriptions are therefore omitted.

The geometric parameters of the crystal 20 of the instantly disclosed multilayer circuit board structure may be configured according to a specific stop band design demand, and the characteristic impedances of each pair of parallel plate transmission lines thereby are subjected to the variations accordingly and shall not be limited by the present disclosure.

(An Exemplary Embodiment of Another Multilayer Circuit Board Structure)

Figure 8:
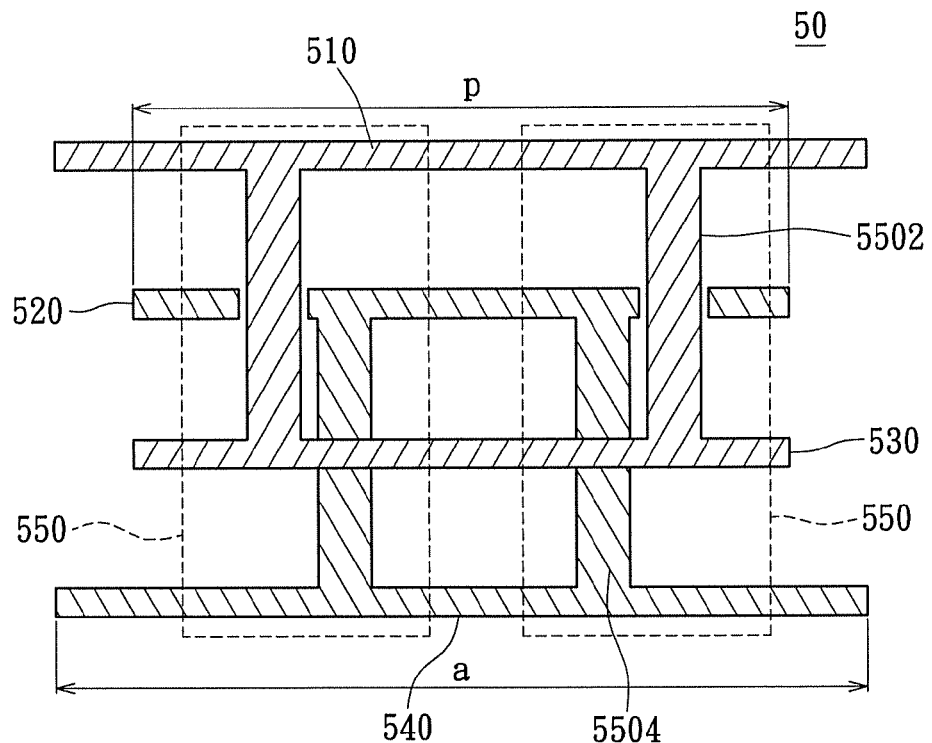
FIG. 8 is a sectional view diagram of a multilayer circuit board structure in accordance to another exemplary embodiment of the present disclosure.

Next, please refer to FIG. 8 which depicts a sectional view of a crystal 50 of a multilayer circuit board structure in accordance to the instant exemplary embodiment of the present disclosure. The crystal 50 is similar to the crystal 20 in FIG. 5 includes conducting planes 510, 520, 530, 540. However, different from the crystal 20, the crystal 50 includes at least two pairs of conducting connectors 550, wherein each pair of conducting connectors 550 includes at least a conducting connector 5502 and at least a conducting connector 5504. The conducting connector 5502 of each pair is electrically configured to connect the conducting plane 510 and the conducting plane 530. The conducting connector 5504 on the contrary is electrically configured to connect the conducting plane 540 to the conducting plane 520. Moreover, the conducting connector 5502 is electrically isolated from the conducting connector 5504. Since the rest structure of the crystal 50 is essentially the same as the crystal 20 of FIG. 5, and further descriptions are therefore omitted.

It is known in the art a bandgap or a stop band bandwidth may be broaden through disposing more conducting connectors to connect the conducting planes 510, 540 to the conducting planes 530, 520, respectively. Consequently, the crystal 50 of FIG. 8 has wider bandwidth than the crystal 20 of FIG. 5. However, the number of pairs conducting connectors 550 used or the number of conducting connectors 5502, 5504 included in a pair on a crystal in a multilayer circuit board structure may depend on the actual size of the multilayer circuit board structure as well as the desired bandwidth required, and thereby should not be limited to examples provided herein.

In addition, it should be noted that a plurality of crystals 50 may be combined and disposed periodically in two dimensions forming a periodic crystal array. However, the detail geometric configurations as to the size and outline shape of the periodic crystal lattice array or the spacing in between each crystal structure may be selected in accordance to a specific design requirement and shall not be limited by the present disclosure.

(An Exemplary Embodiment of a Multilayer Circuit Board Structure)

Figure 9:
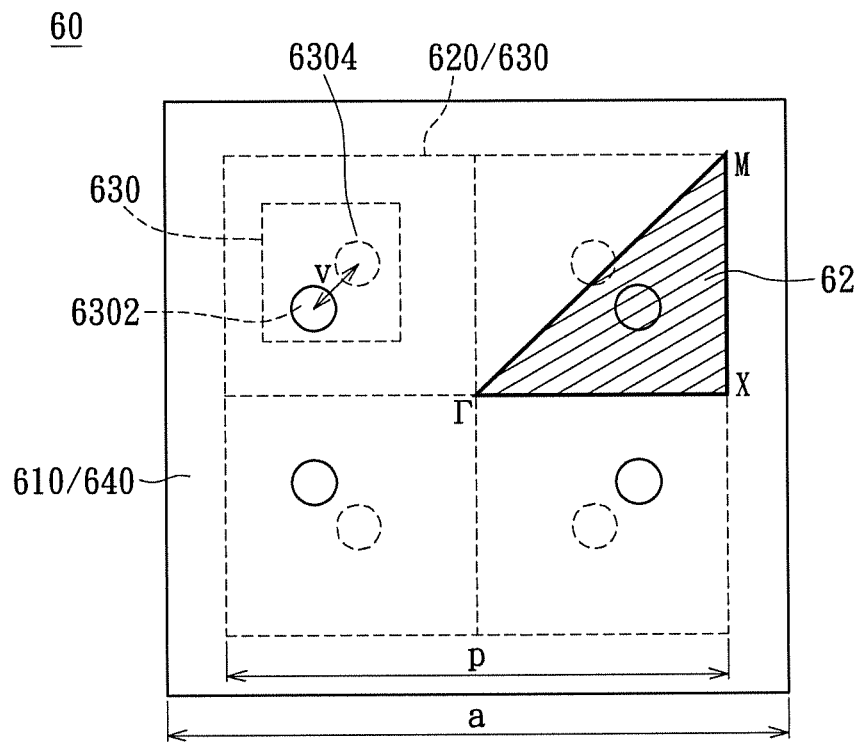
FIG. 9 is a top view diagram of a multilayer circuit board structure in accordance to another exemplary embodiment of the present disclosure.

Please refer to FIG. 9, which depicts a top view of a crystal 60 of a multilayer circuit board structure in accordance to the instant exemplary embodiment of the present disclosure. The crystal 60 includes the conducting planes 610, 620, 630, 640 and at least four pairs of conducting connectors 630, wherein each pair of conducting connectors 630 includes a conducting connector 6302 and a conducting connector 6304. The outline dimensions of the conducting planes 610, 640 are described by the side length parameter a, while the outline dimensions of the conducting planes 620, 630 are described by a side length parameter p. The conducting planes 620, 630 are embedded between the conducting planes 610, 640. As shown in FIG. 9, the conducting planes 620, 630 are divided into four equally spaced portions. Each pair of conducting connectors 630 is substantially anchored at the center of the quarter conducting planes 620, 630, respectively. Further, the center to center pitch between the conducting connector 6302 and the conducting connector 6304 of each pair of conducting connectors 630 is denoted by a parameter v. Moreover, the four pairs of conducting connectors 630 are disposed symmetrically along a circular path. However, the four pairs of conducing connectors 630 may also be disposed along a diagonal, vertical, or horizontal path. Therefore, it is important to note that the center to center pitch v between the conducting connectors 6302, 6304 as well as the placements of each pair of conducting connectors 630 may vary according to design requirements and/or fabrication limitations and shall not be limited to the examples provided herein. Similarly, the outline dimensions and shapes of the conducting planes 610, 620, 630, 640 may vary in accordance to the design and/or application requirements and hence is also not limited to the crystal 60 shown in FIG. 9.

It is worth mentioning that the crystals 50 in FIG. 8 and 60 in FIG. 9 may be implemented onto PCB board. The conducting planes 510, 540, or 610, 640 may be a power or a ground planes and the conducting planes 520, 530 or 620, 630 may be the embedded patches. The conducting connectors 5302, 5304, 6302, 6304 may be constructed using via or wire. The power or the ground planes may through the conducting connectors connect to the embedded patches, thereby establishes a PDN, function as a band stop filter to suppress the undesired electromagnetic noise, for example the SSN. However, the exact multilayer circuit board structure and conducting connectors implementations adopted depend on a specific design and/or application requirements and shall not be limited to the examples provided by the instant embodiment.

Figure 10:
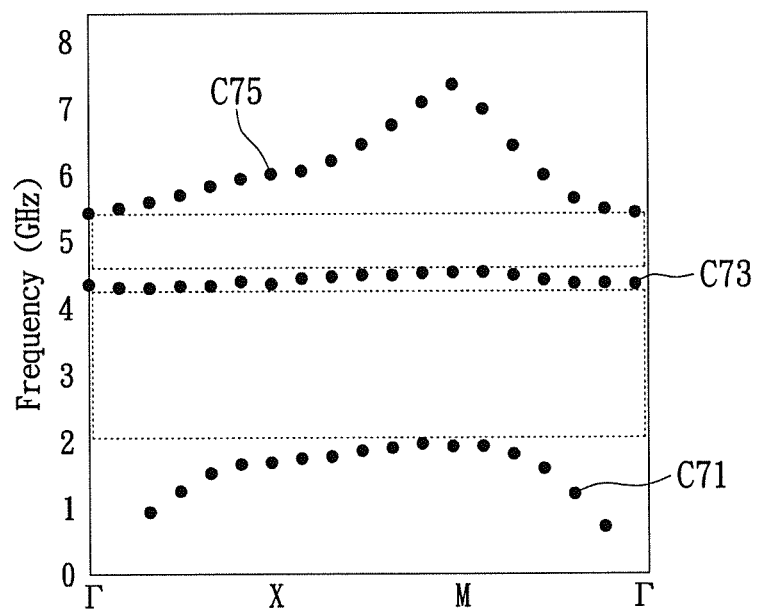
FIG. 10 is a dispersion diagram of a multilayer circuit board structure in accordance to an exemplary embodiment of the present disclosure
Figure 11:
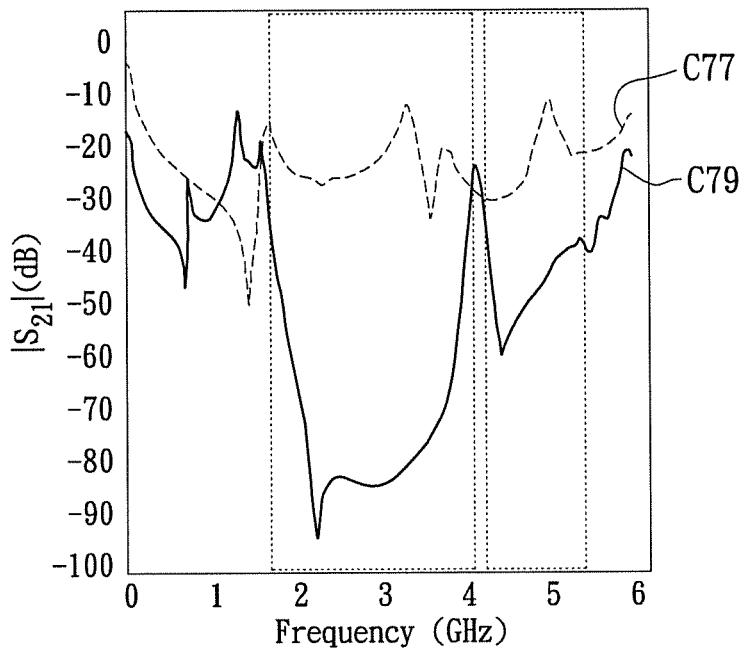
FIG. 11 is a transmission loss curve diagram of the multilayer circuit board structure in accordance to an exemplary embodiment of the present disclosure.

Please refer to FIG. 10 and FIG. 11 in conjunction with FIG. 9. FIG. 10 and FIG. 11 illustrates a dispersion diagram and a transmission loss plot, respectively for a multilayer circuit board structure with a plurality of the crystals 60, distributed periodically in two-dimension of the present disclosure.

A dispersion diagram generally illustrates the propagation of electromagnetic waves over a set of frequency range and may be adopted for stop band prediction. The dispersion diagram is a plot of propagation constant versus a set of frequency range (i.e., 1-8 GHZ). Further to generate the dispersion diagram, a multilayer circuit board structure has to be defined and the appropriate periodic boundary conditions (PBCs) have to be applied as for instance, the Brillouin zone 62 shown in FIG. 9. The Brillouin zone 62 is the fundamental region for defining the electromagnetic wave propagation vectors. In particular, as shown in FIG. 9, the dispersion diagram starts at Γ then propagate to X then to M and back to Γ as indicated by the triangular path depicted on the Brillouin zone 62, wherein Γ, X, M are the propagation constants.

The dispersion diagram of FIG. 10 is generated in accordance to the multilayer circuit board structure with a plurality of crystals 60 using the Brillouin zone 62 boundary condition and with following geometric parameters: the side length parameter a of the conducting planes 610, 640 being 15 mm, the side length parameter p of the conducting planes 620, 630 being 10 mm, the center to center pitch v between the conducting connectors 6302, 6304 of each pair of the conducting connectors 630 being 3 mm and the separation between each adjacent conducting planes (not shown in FIG. 9) being 0.127 mm.

The electromagnetic waves propagation curves C71, C73, and C75 shown in FIG. 10 describe the first, the second, and the third mode electromagnetic wave propagation curves, respectively. The frequency gap between each propagation wave mode defines the bandgap associated with the disclosed multilayer circuit board structure of the instant embodiment. It is known in the art, no electromagnetic wave can propagate in any direction in the multilayer circuit board structure within the bandgap, thereby establishes a stop band. As can be seen from FIG. 10, unlike the conventional mushroom shaped EBG structure 10, there are two bandgaps associated with the instantly disclosed multilayer circuit board structure. The first bandgap formed between the first and the second mode electromagnetic wave propagation curves C71, C73, wherein the bandgap lies approximately between 1.8 GHz to 4.3 GHz. The second bandgap formed between the second and the third mode electromagnetic wave propagation curves C73, C75, wherein the bandgap approximately lies between 4.4 GHz to 5.4 GHz.

Moreover, the described bandgaps associated with the instantly disclosed multilayer circuit board structure may also be extracted from the transmission loss plot of FIG. 11 which plots the transmission loss coefficient or the $S_{21}$ in dB versus a set of frequency range of the disclosed multilayer circuit board structure includes a plurality of periodically disposed crystals 60 (e.g., 1-6 GHz). In general, a transmission loss plot describes how much attenuation an electromagnetic wave might experience while travel through a medium (e.g., a multilayer circuit board structure). The curve C77 represents a simulated result of the conventional two-layer circuit board structure (e.g., a circuit board structure consisting of a power and a ground layers) and the curve C79 represents a simulated result of the four-layer circuit board using the disclosed multilayer circuit board structure formed by the crystals 60. It may be noted from the FIG. 11, there are two sets of frequency range (i.e., 1.8 GHz to 4.3 GHz and 4.4 GHz to 5.4 GHz) associated with curve C79, in which the electromagnetic waves becomes most attenuated (i.e., $S_{21}$ being −96 dB and −62 dB, respectively). On the other hand, there is only one set of frequency range (i.e., between 1.2 GHz to 1.8 GHz) associated with curve C77 where the electromagnetic waves become the most attenuated (i.e., $S_{21}$ being −51 dB). Furthermore, it may be obviously seen that the curve C79 not only has wider attenuation zone than the curve C77, but also has higher attenuation within the defined attenuation zone than the curve C79. The multilayer circuit board structure formed by the crystals 60 may thereby effectively suppress the undesired electromagnetic wave propagation.

Figure 12:
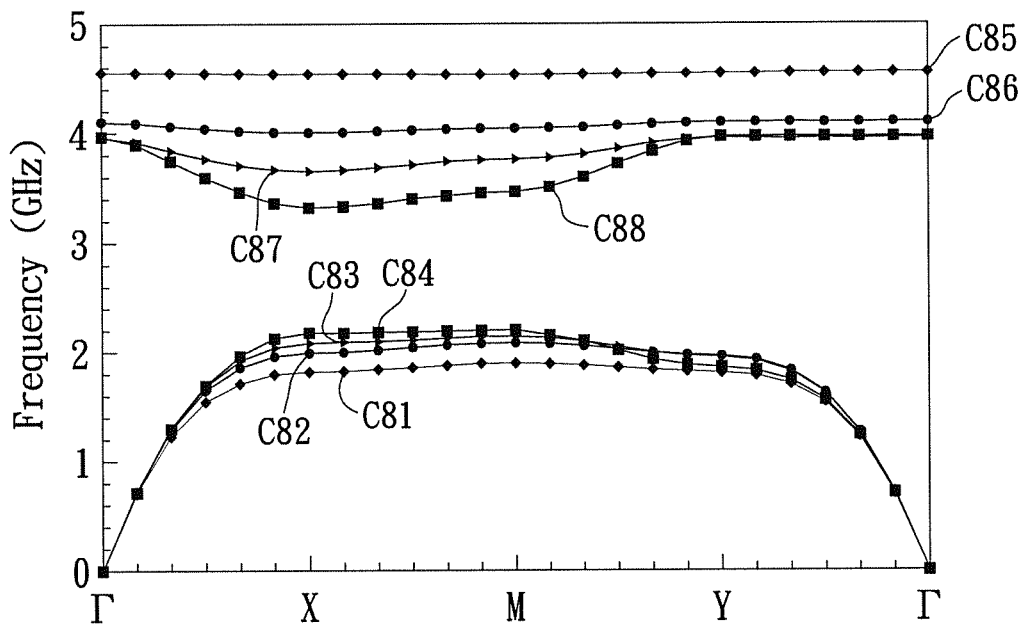
FIG. 12 is a dispersion diagram of the multilayer circuit board structures with different center to center pitches in accordance to an exemplary embodiment of the present disclosure.

Next, please refer to FIG. 12 in conjunction with FIG. 4, which illustrates an exemplary dispersion diagram of disclosed multilayer circuit board structure of instant embodiment with respect to various center to center pitches v between the conducting connectors 250, 260. Furtherer, each crystal 20 of the multilayer circuit board structure is configured to have the side length parameter a of the conducting planes 210, 240 being 4 mm, the side length parameter p of the conducting planes 220, 230 being 3.8 mm, the separations between the adjacent conducting planes being 45 um, and the radius of the conducting connectors 250, 260 being 37.5 um.

The first mode electromagnetic wave propagation curve C81 and the second mode electromagnetic wave propagation curve C85 are generated with center to center pitch v between the conducting connector 250 and the conducting connector 260 being 0.21 mm. The first mode electromagnetic wave propagation curve C82 and the second mode electromagnetic wave propagation curve C86 are generated with center to center pitch v between the conducting connector 250 and the conducting connector 260 being 1 mm. The first mode electromagnetic wave propagation curve C83 and the second mode electromagnetic wave propagation curve C87 are generated with center to center pitch v between the conducting connector 250 and the conducting connector 260 being 2 mm. The first mode electromagnetic wave propagation curve C84 and the second mode electromagnetic wave propagation curve C88 are generated with center to center pitch v between the conducting connector 250 and the conducting connector 260 being 3 mm. It may be observed from FIG. 12 that by decreasing the center to center pitch v between the conducting connectors 250, 260, while keeping the rest of geometric parameters constant, the lower cutoff frequency is slightly lowered while the upper cutoff frequency is greatly improved, i.e., moved toward the higher band. Equivalently, by reducing the center to center pitch v between the conducting connectors 250, 260, the stop band bandwidth may be broadened.

It is worth mentioning that FIG. 10-FIG. 12 are only exemplary diagrams generated by a type of electromagnetic field simulation software and only serve as references to describe the stop band bandwidth of the instantly disclosed multilayer circuit board structure, however results may be differed according to different geometric configurations of the instantly disclosed multilayer circuit board structure and boundary conditions adopted, and hence the present disclosure shall not be limited to the example illustrated in FIG. 10-FIG. 12.

(An Exemplary Embodiment of a Multilayer Circuit Board Structure)

Figure 13:
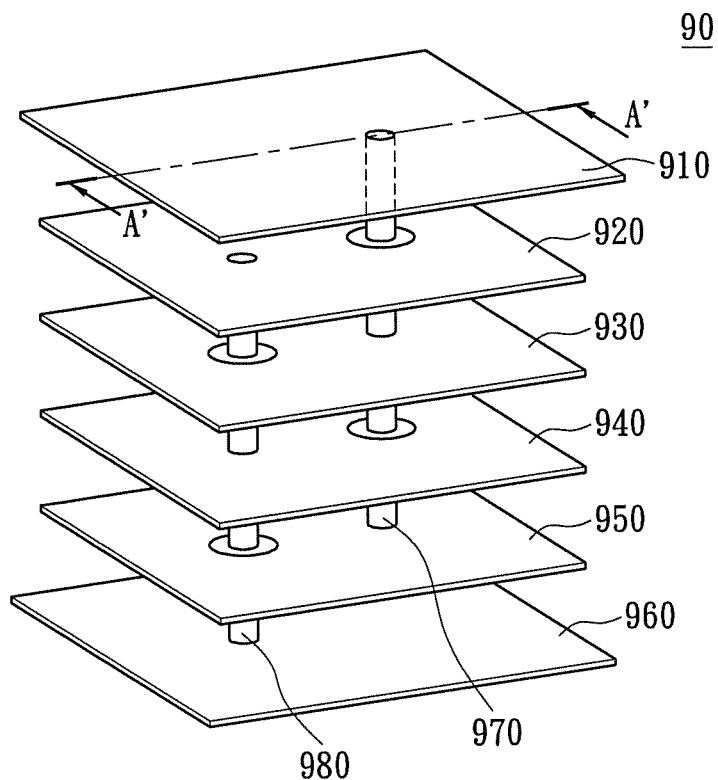
FIG. 13 is a three-dimensional diagram of a multilayer circuit board structure in accordance to another exemplary embodiment of the present disclosure.
Figure 14:
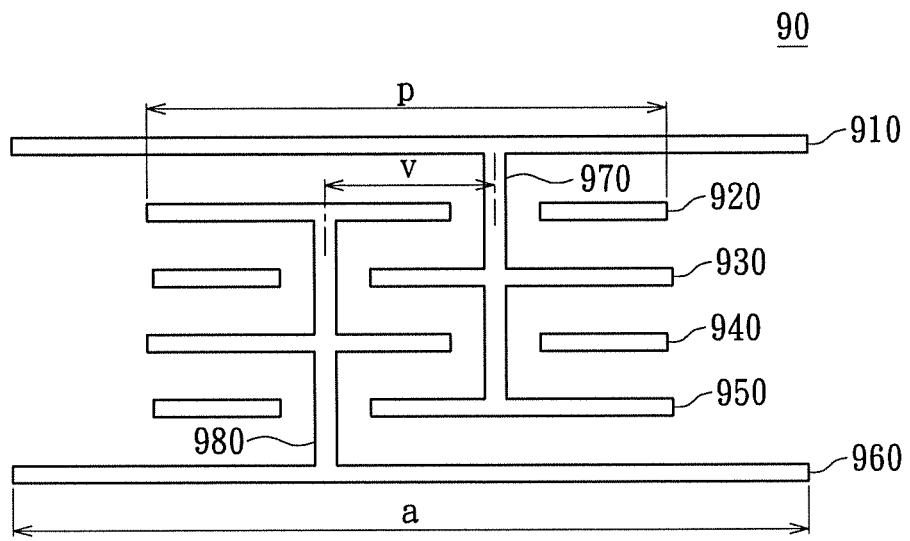
FIG. 14 shows a sectional view diagram of a multilayer circuit board structure in accordance to another exemplary embodiment of the present disclosure.

Please refer to FIG. 13 in conjunction with FIG. 14. FIG. 13 illustrates a multilayer circuit board structure with at least one crystal 90 in accordance to an instant exemplary embodiment of the present disclosure. FIG. 14 provides a sectional view (along with the section curve A'-A') of a crystal 90 in accordance to the instant exemplary embodiment of the present disclosure. The crystal 90 includes the conducting planes 910, 920, 930, 940, 950, 960 and the conducting planes 920, 930, 940, 950 are embedded accordingly between the conducting planes 910, 960.

Moreover, the conducting plane 910 is configured to be electrically connected to the conducting planes 930, 950 through a conducting connector 970. The conducting plane 960 is configured to be electrically connected to the conducting planes 920, 940 through a conducting connector 980. The conducting connectors 970, 980 are electrically isolated from each other. Equivalently, the conducting planes 910, 930, 950 are electrically separated from the conducting plane 920, 940, 960.

It may be obviously seen that the crystal 90 is basically an extension of the crystal 20 of FIG. 4 by includes additional conducting planes 940, 950 to form a six-layer crystal structure. Hence the geometric configurations of crystal 90 are essentially same as the aforementioned embodiments and further descriptions are therefore omitted.

However, it should be noted the crystal 20 may also be extend by just adding a conducting plane (e.g., the conducting plane 940 or the conducting plane 950) to form a five-layer crystal structure. The conducting plane may be electrically connected by one of the conducting connectors 970, 980 while electrically isolated from the other, to establish the desired electric plane network (i.e., the power or the ground plane network). Based on the above explanation, those skilled in the art should be able to deduce other geometric extensions or multilayer structure implementations associated with the disclosed crystal of the multilayer circuit board structure, and shall not be limited to the multilayer circuit board structure described herein.

It is worth mentioning that the instantly disclosed multilayer circuit board structure with a plurality of crystals 90 may be implemented onto PCB board for suppressing the undesired electromagnetic noise. The conducting planes 910, 960 may be configured to be a power and a ground plane, respectively. The conducting planes 920, 930, 940, 950 may be the embedded patches between the power and the ground layers, serve to distribute the power and the ground planes accordingly. Consequently, the conducting connectors 970, 980 may each be implemented by a via or a wire, employed to connect the power or the ground plane to a desired embedded patch (i.e., the conducting planes 920, 930, 940, 950) thereby establish a PDN. However, the exact implementation of the multilayer circuit board structure and the conducting connectors adopted depend on a specific design and/or application requirements and shall not be limited to the examples provided by the instant embodiment.

(An Exemplary Embodiment of a Multilayer Circuit Board Structure)

Figure 15:
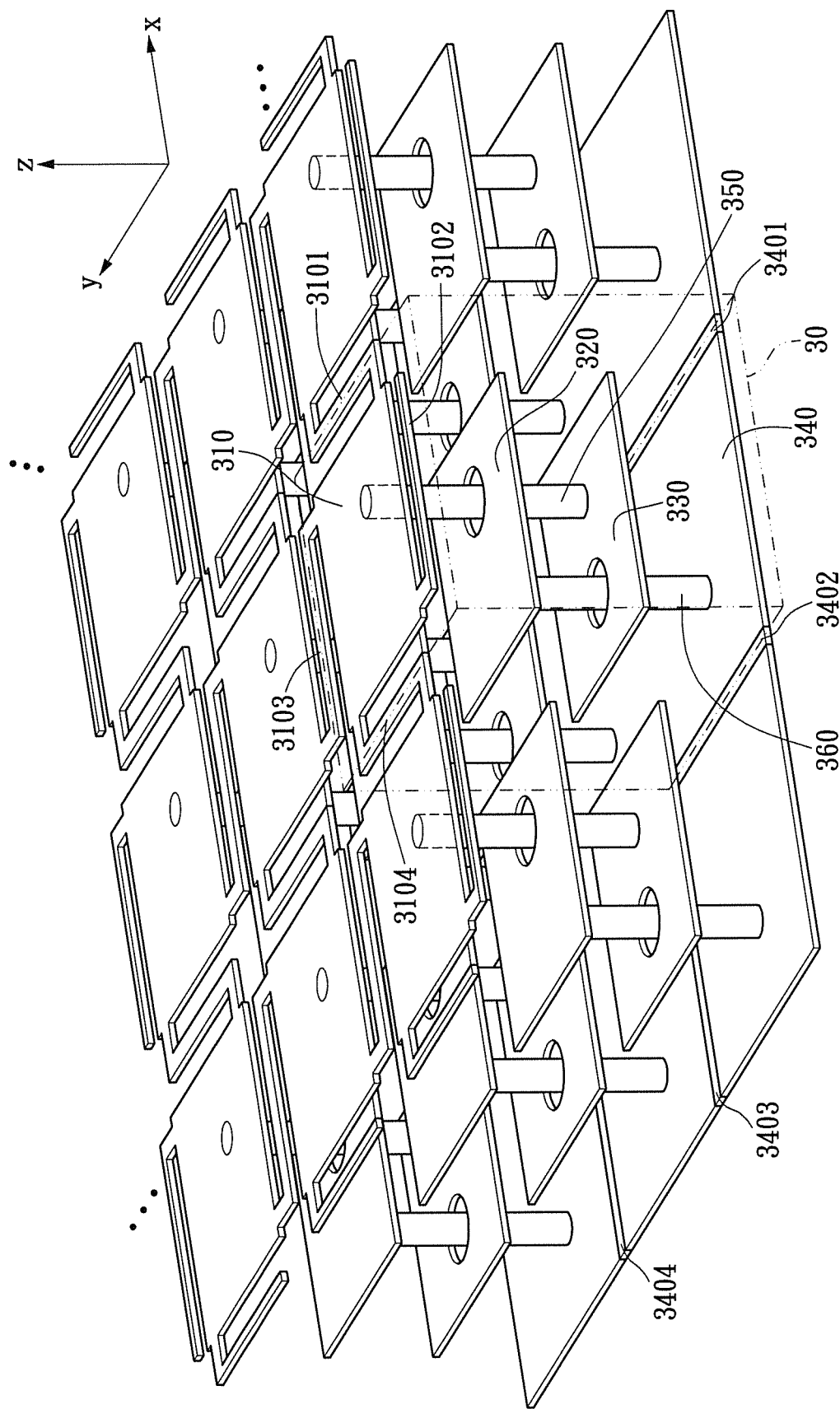
FIG. 15 shows a three-dimensional diagram of a multilayer circuit board structure in accordance to one exemplary embodiment of the present disclosure.
Figure 16:
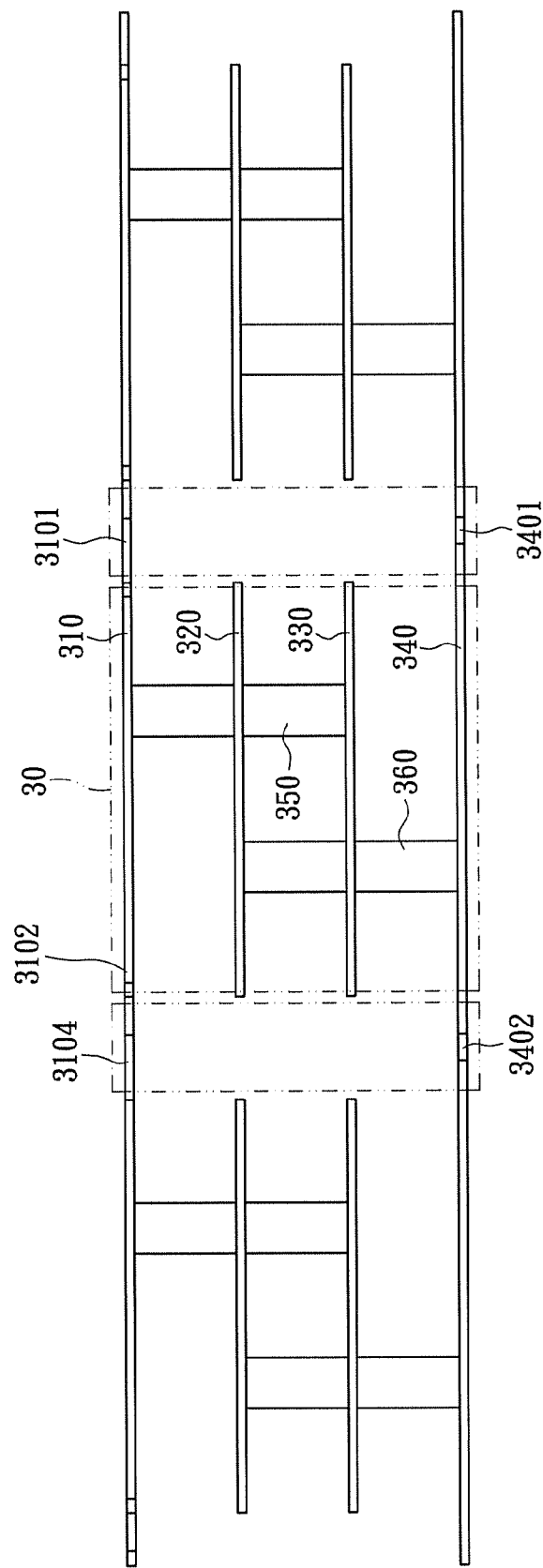
FIG. 16 shows a side view of a multilayer circuit board structure in accordance to the exemplary embodiment of the present disclosure.

Please refer to FIG. 15 in conjunction with FIG. 16, which respectively illustrates a three-dimensional view and a corresponding side view (e.g., viewing along the y-direction) for a multilayer circuit board structure in accordance to the instant exemplary embodiment of the present disclosure. The multilayer circuit board structure includes a plurality of periodically uniformly disposed crystals 30 and a plurality of conducting channels 3101, 3102, 3103, 3104, 3401, 3402, 3403, 3404. A crystal 30 of FIG. 16 similar to the crystal of FIG. 4 includes conducting planes 310, 320, 330, 340, at least a conducting connectors 350, and at least a conducting connector 360. Moreover, the conducting connector 350 electrically connects the conducting plane 310 to the conducting plane 330. Similarly, the conducting connector 360 electrically connects the conducting plane 340 to the conducting plane 320. Further, since the crystals 30 are arranged periodically to form the multilayer circuit board structure, with each crystals are electrically connected through at least one of the plurality disposed conducting channels 3101, 3102, 3103, 3104, 3401, 3402, 3403, 3404 between the conducting planes located each crystal 30.

However, the difference between the multilayer circuit board structure of FIG. 15 and the multilayer circuit board structure of FIG. 4 is the type of the conducting channels used. As illustrated in FIG. 15 and FIG. 16, the conducting channels 3101, 3102, 3103, 3104, 3401, 3402, 3403, 3404 are disposed on in between the conducting planes of the crystal 30 for electrically connecting to the conducting planes located in the adjacent crystals 30.

For instance, the conducting channels 3101, 3103, 3104 electrically connect the conducting plane 310 of the crystal 30 and the conducting planes 310 of the adjacent horizontally and vertically oriented (e.g., oriented in the x-direction and y-direction, respectively) crystals 30 thereby establish an electrical plane connection between the conducting planes 310 located in the corresponding crystals 30. Alternatively, the conducting channels 3401, 3402, 3403, 3404 electrically connect the conducting plane 340 of the crystal 30 and the conducting planes 340 of the adjacent horizontally and vertically oriented (e.g., oriented in the x-direction and y-direction, respectively) crystals 30 thereby establish an electrical plane connection between conducting planes 340 located in the associated crystals 30.

In practice, the conducting channels 3101, 3102, 3103, 3104, 3401, 3402, 3403, 3404 may have a plurality of fold sections and forming different serpentine shapes such as spiral-shaped, L-shaped, Z-shaped, etc. Taking FIG. 15 as an example for illustration, the conducting channels 3101, 3102, 3103, 3104, 3401, 3402, 3403, 3404 have two fold sections thus form Z-shaped connectors.

It may be noted from FIG. 15, the conducting channels 3101, 3102, 3103, 3104 disposed between the conducting planes 310 of the crystals 30 taking on Z-shape form, while the conducting channels 3401, 3402, 3403, 3404 of the conducting plane 340 taking on a strip-shaped form. Consequently, the conducting planes in the same crystal may use the conducting channels of different shapes and dimensions so long as the types of conducting channels adopted can achieve the required electrical connections between each adjacent crystal. In other words, FIG. 15-FIG. 16 only serve as an illustration and the present disclosure therefore is not limited thereto.

Furthermore, the rest of the geometric configurations of the crystal 30 are essentially same as the aforementioned embodiments and further descriptions are therefore omitted. Those skilled in the art should be able to deduce other geometric configurations and/or placements associated with the conducting channels and hence shall not be limited to the multilayer circuit board structure described herein.

Figure 17:
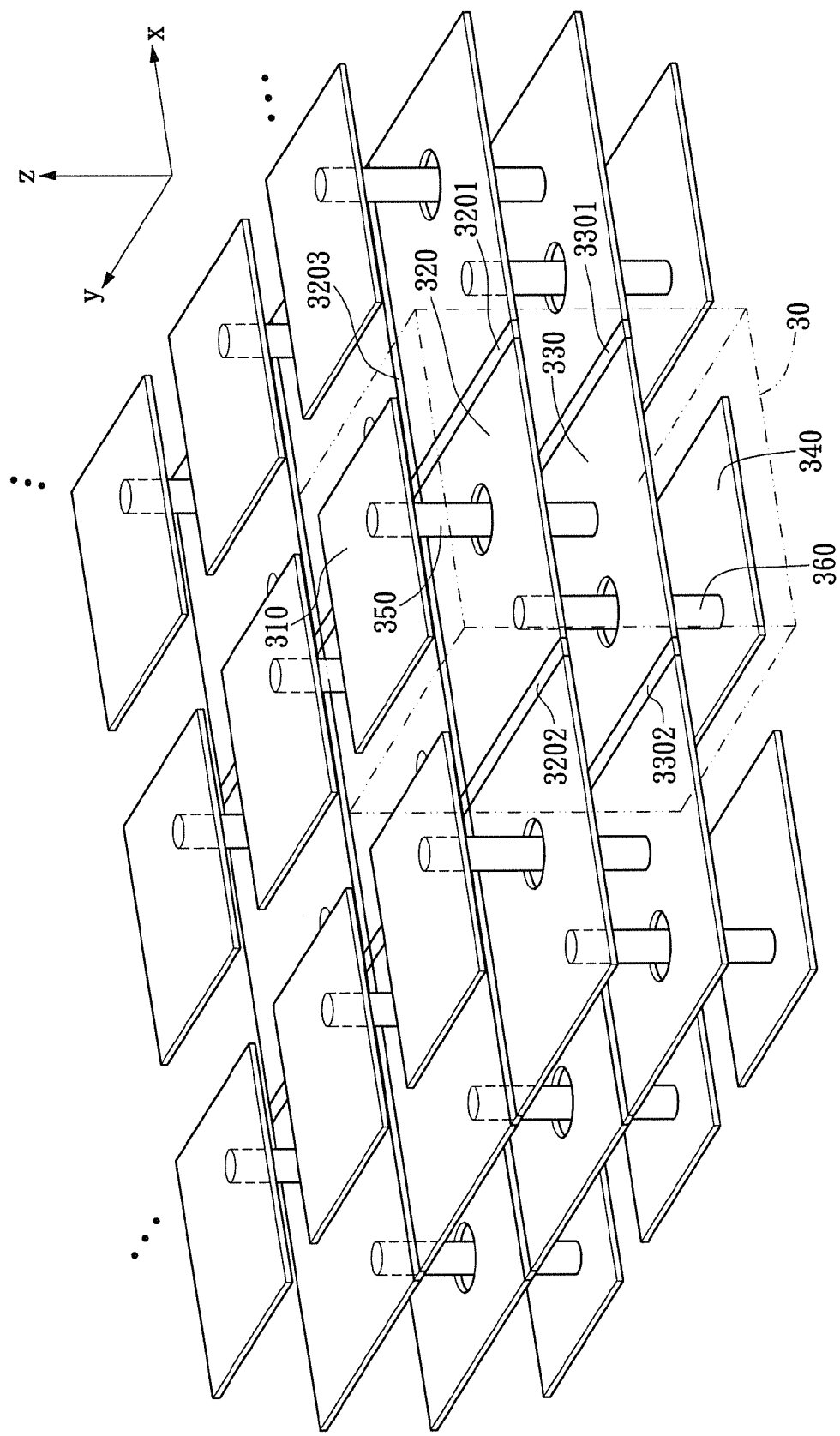
FIG. 17 shows a three-dimensional diagram of a multilayer circuit board structure in accordance to one exemplary embodiment of the present disclosure.
Figure 18:
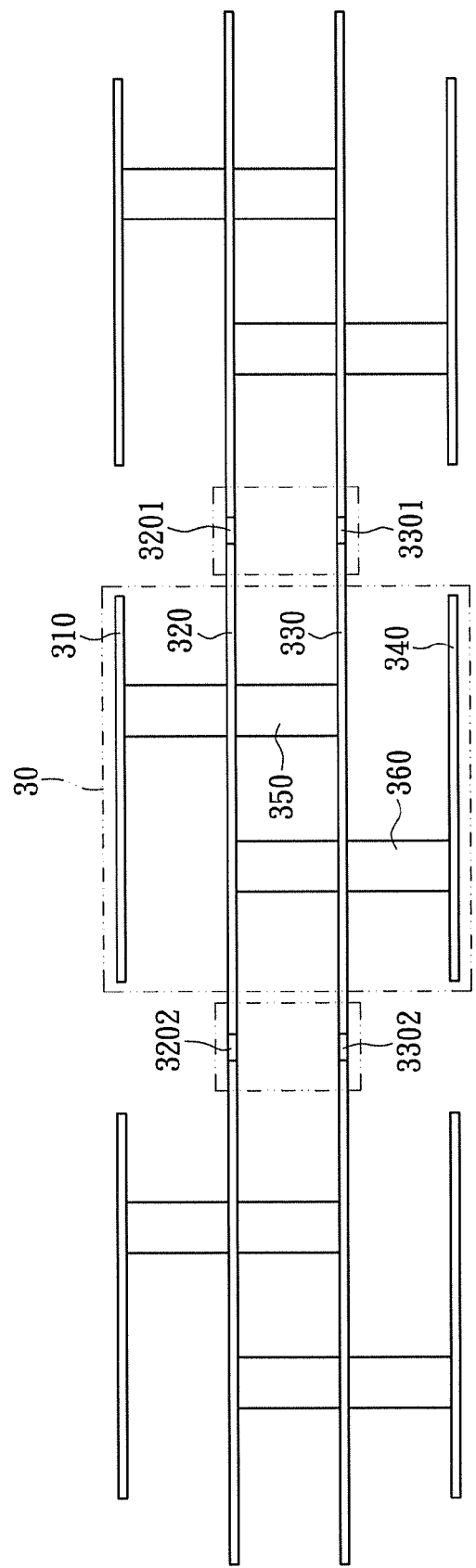
FIG. 18 shows a side view of a multilayer circuit board structure in accordance to the exemplary embodiment of the present disclosure.

Please refer to FIG. 17 in conjunction with FIG. 18, which respectively illustrates a three-dimensional view and a corresponding side view (e.g., viewing along the y-direction) for a multilayer circuit board structure in accordance to the instant exemplary embodiment of the present disclosure. Similarly, the instantly disclosed multilayer circuit board structure includes a plurality of periodically uniformly disposed crystals 30 and a plurality of conducting channels 3201, 3202, 3203, 3301, 3302. Further, a crystal 30 of FIG. 18 is similar to the crystal 30 of FIG. 16, including the conducting planes 310, 320, 330, 340, at least a conducting connector 350, and at least a conducting connector 360. However, the main differences between the multilayer circuit board structure of FIG. 17 and the multilayer circuit board structure of FIG. 15 are the type of the conducting channels and the placements thereof adopted. In the instant exemplary embodiment, the conducting channels are disposed between the conducting planes 320, 330 instead of the conducting planes 310, 340. As illustrated in FIG. 17, the conducting channels 3201, 3202, 3203 are disposed between the conducting planes 320 of the crystals 30 and the conducting channels 3301, 3302 are disposed between the conducting planes 330 of the crystals 30

Furthermore, the conducting channels 3201, 3202, 3203, 3301, 3302 which are disposed between the coplanar conducting plane 320, 330 of the crystals 30 adopted strip-shaped form of conducting plates and are used for sealing the coplanar gap between the conducting planes 320, 330 of the crystals 30 respectively thereby forming electrical plane networks. (i.e., a power plane network or a ground plane network). Furthermore, based on the explanation of the aforementioned exemplary embodiment, those skilled in the art should be able to deduce other geometric configurations and orientations the conducting channels in the instant embodiment and further descriptions are therefore omitted. It should be noted that FIG. 17 and FIG. 18 only serve as an exemplary illustration and the present disclosure shall not be limited to the multilayer circuit board structure described herein.

(An Exemplary Embodiment of a Multilayer Circuit Board Structure)

Figure 19:
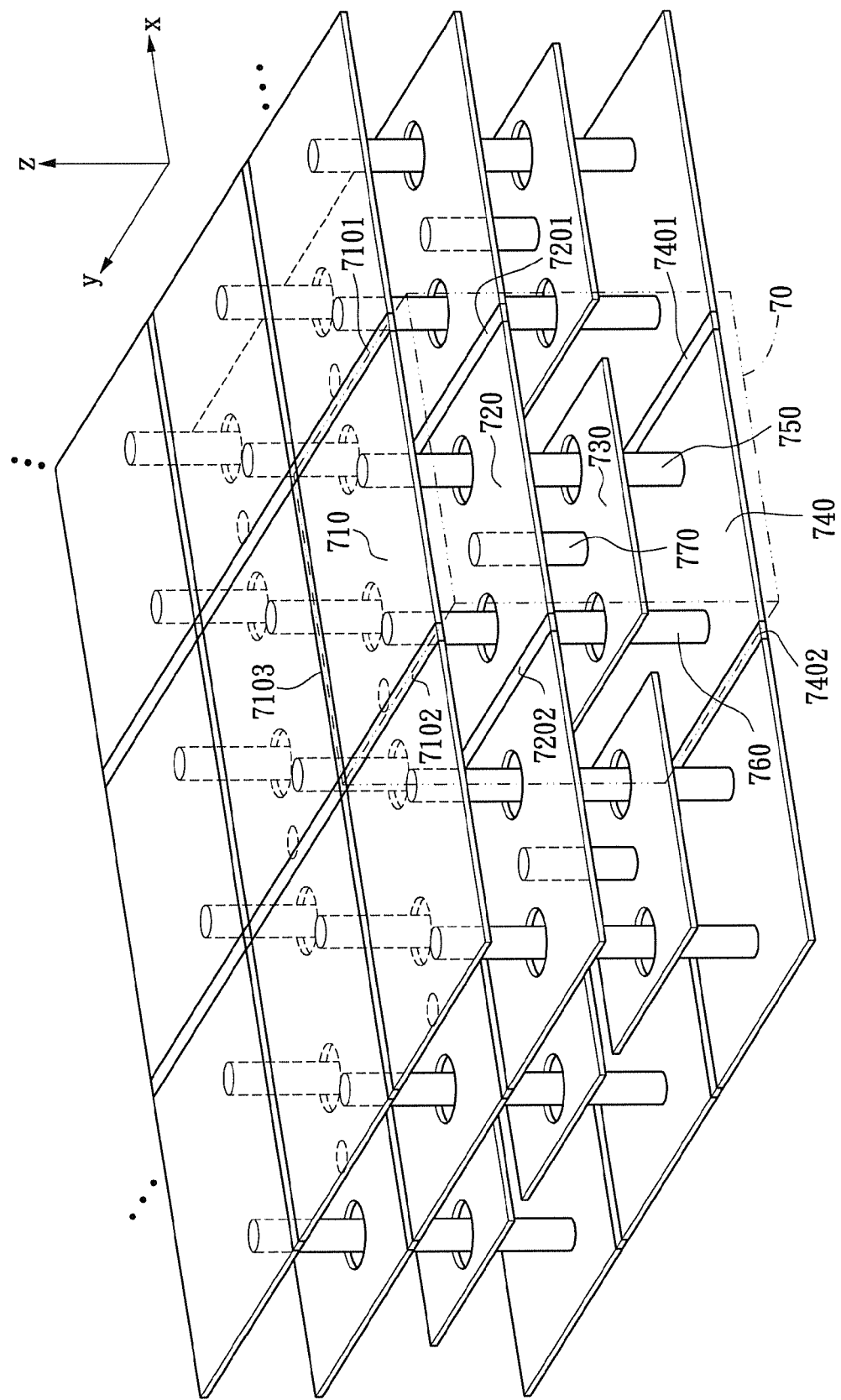
FIG. 19 shows a three-dimensional diagram of a multilayer circuit board structure in accordance to one exemplary embodiment of the present disclosure.
Figure 20:
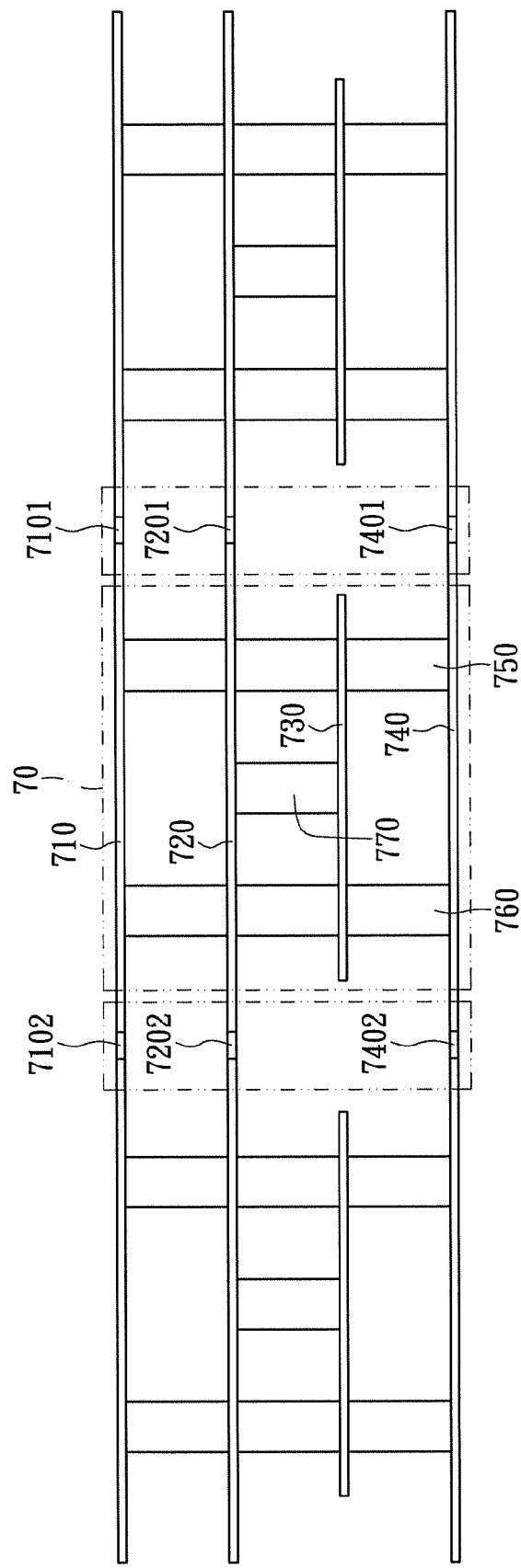
FIG. 20 shows a side view of a multilayer circuit board structure in accordance to the exemplary embodiment of the present disclosure.

Please refer to FIG. 19 in conjunction with FIG. 20, which respectively illustrates a three-dimensional view and a corresponding side view (e.g., viewing along the y-direction) for a multilayer circuit board structure in accordance to the instant exemplary embodiment of the present disclosure. The multilayer circuit board structure includes a plurality of periodically uniformly disposed crystals 70 and a plurality of conducting channels 7101, 7102, 7103, 7201, 7202, 7401, 7402. A crystal 70 of FIG. 20 similar to the crystal 30 of FIG. 18 includes the conducting planes 710, 720, 730, 740. However, the crystal 70 further includes the conducting connectors 750, 760, 770. In which, the conducting connectors 750, 760 as shown in FIG. 19 are disposed in a horizontal path. The conducting connector 770 is anchored to the center of the conducting plane 740.

Moreover, the crystal 70 is structurally different from the crystal 30 in that the conducting plane 710 is now electrically connected to the conducting plane 740 through the conducting connectors 750, 760 while the conducting plane 720 is electrically connected to the conducting plane 730 through the conducting connector 770.

Additionally, the conducting connectors 750, 760 and the conducting connector 770 may form a pair of conducting connectors for the crystal 70. However, it should be noted that in practice the actual number of conducting connectors adopted in a crystal as well as the associated placements may vary according to the overall structure and/or stop band bandwidth design considerations, therefore shall not be limited to the crystal described herein.

Moreover, it should be noted that the radius of the conducting connectors 750, 760, 770 may not be the same. Equivalently, the conducting connectors 750, 760, 770 used may have different radius according to the stop band bandwidth design considerations, therefore shall not be limited to the crystal described herein.

Furthermore, the conducting channels 7101, 7102, 7103 are disposed between the conducting planes 710 of the crystals 70 to electrically connect the coplanar conducting planes 710 of the crystals 70. The conducting channels 7201, 7202 are disposed between the conducting planes 720 of the crystals 70 to electrically connect the coplanar conducting planes 720 of the crystals 70. The conducting channels 7401, 7402 are disposed between the conducting planes 740 of the crystals 70 to electrically connect the coplanar conducting planes 740 of the crystals 70.

It is worth mentioning that the type of conducting channels adopted in FIG. 19 may be strip-shaped conductor plates such as metallic strips for sealing the gap between the conducting planes 710, 720, 740 between the crystals 70. However, the physical implementations of the conducting channels (i.e., conducting channels 7101, 7102, 7103, 7201, 7202, 7401, 7402) adopted may take on different geometric shapes as long as the gap between the conducting planes 710, 720, 740 of the crystals 70 can be completely sealed to establish the required electrical connection network, and shall not be limited to the example provided herein.

Since the conducting plane 710 is electrically connected to the conducting plane 740, consequently a Type A electrical plane network. (e.g., power plane network on a PCB board) may be formed. Similarly, the Type B electrical plane network (e.g., ground plane network on a PCB board) may be formed from the conducting planes 720, 730.

Figure 21:
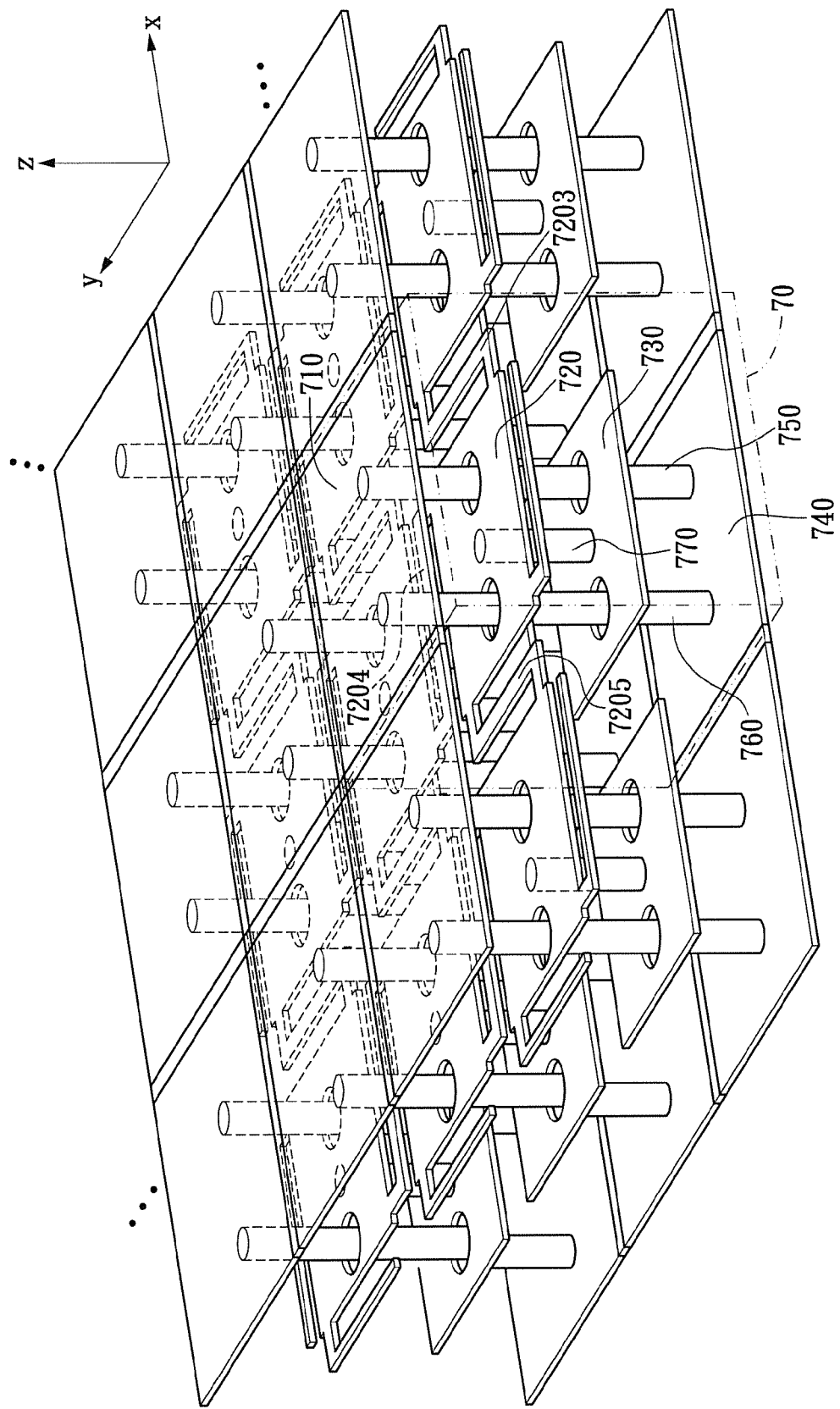
FIG. 21 shows a three-dimensional diagram of a multilayer circuit board structure in accordance to one exemplary embodiment of the present disclosure.
Figure 22:
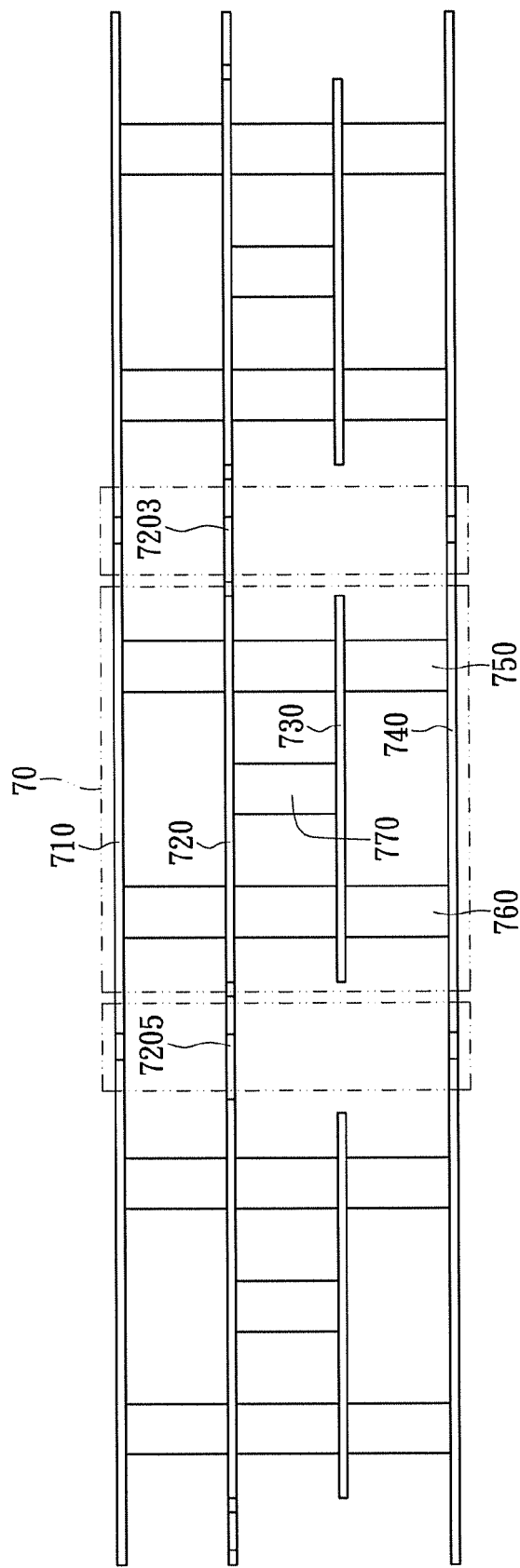
FIG. 22 shows a side view of a multilayer circuit board structure in accordance to the exemplary embodiment of the present disclosure.

Next, please refer to FIG. 21 in conjunction with FIG. 22, which respectively illustrates a three-dimensional view and a corresponding side view (e.g., viewing along the y-direction) for a multilayer circuit board structure in accordance to the instant exemplary embodiment of the present disclosure. The main difference between the multilayer circuit board structure of FIG. 21 and the multilayer circuit board structure of FIG. 19 is the type of the conducting channels adopted in the conducting plane 720 of each crystal 70. Specifically, the Z-shaped conducting channels 7203, 7204, 7205 are disposed between the conducting plane 720 of the crystals 70 for electrically connecting the coplanar conducting planes 720 in the crystals 70. For example, the conducting channel 7203 is disposed for electrically connecting between the conducting plane 720 of the crystal 70 and the coplanar conducting plane 720 of an adjacent horizontally-oriented (oriented in the x-direction) crystal 70. The conducting channel 7204 is disposed for electrically connecting between the conducting plane 720 of the crystal 70 and the coplanar conducting plane 720 of an adjacent vertically-oriented (oriented in the y-direction) crystal 70.

Figure 23:
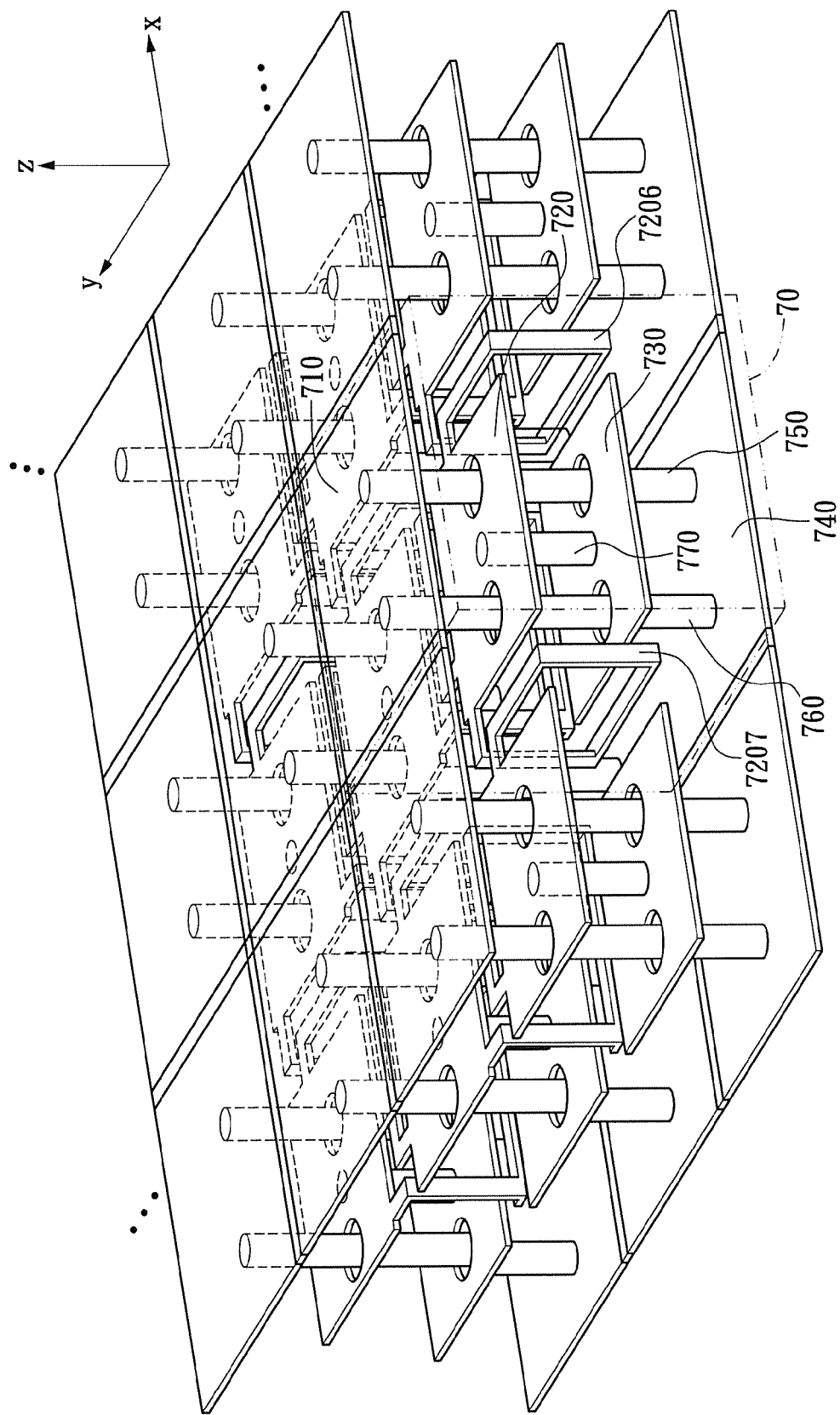
FIG. 23 shows a three-dimensional diagram of a multilayer circuit board structure in accordance to one exemplary embodiment of the present disclosure.
Figure 24:
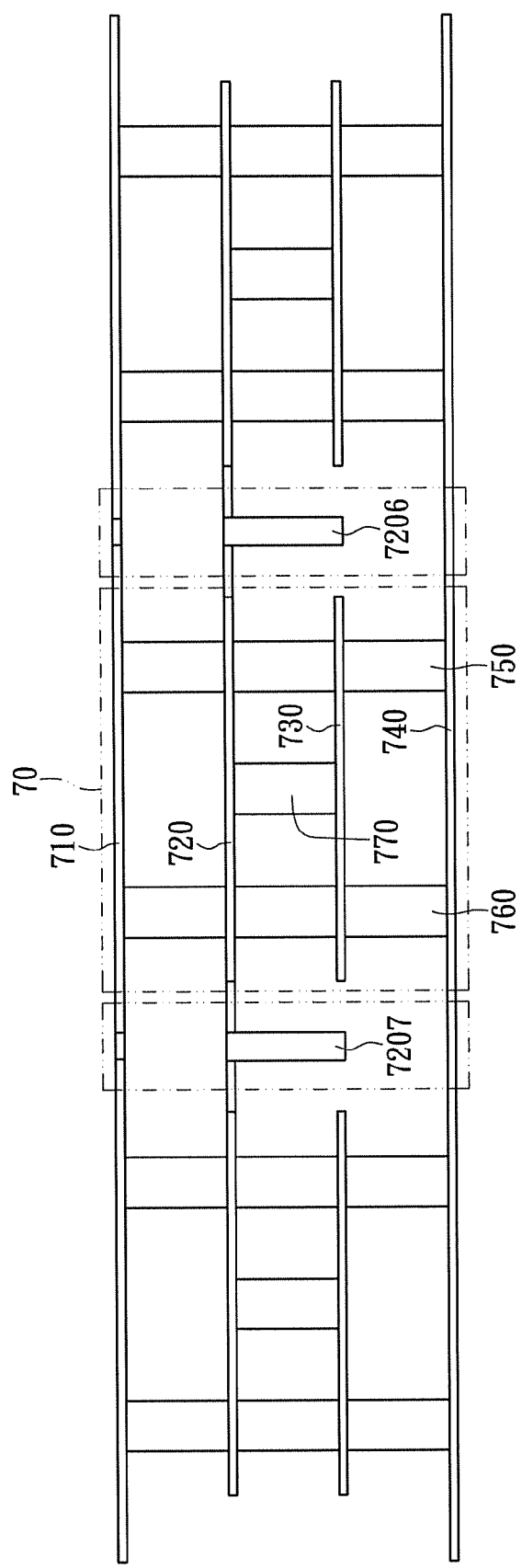
FIG. 24 shows a side view of a multilayer circuit board structure in accordance to the exemplary embodiment of the present disclosure.

Next, please refer to FIG. 23 in conjunction with FIG. 24, which respectively illustrates a three-dimensional view and a corresponding side view (e.g., viewing along the y-direction) for a multilayer circuit board structure in accordance to the instant exemplary embodiment of the present disclosure. The main difference between the multilayer circuit board structure of FIG. 23 and the multilayer circuit board structure of FIG. 21 is the type of the conducting channels used to electrically connect the conducting planes 720 of between the crystals 70. As illustrated in FIG. 23, the conducting channels 7206, 7207, includes a plurality of fold sections and further is routed in an upward/downward directions (i.e., up and down in the z-axis direction). Or equivalently, the conducting channels 7206, 7207 disposed are routed along z-direction and in a single-winding square loop to electrically connect the crystals 70 to the coplanar conduction planes 720 of the adjacent crystals 70. However, the actual geometric configurations of the conducting channel 7206, 72027 may vary (e.g., may be a circular loop, a triangular loop or a hexagonal loop having a plurality of windings in a loop) according to the physical structure limitation or and hence shall not be limited by the example provided herein.

Furthermore, the conducting channels 7206, 7207 may also be used to electrically connect conducting planes of different layers having same electrical level. For instance, the conducting channels 7206, 7207 may routed to electrically connect between the conducting plane 720 of the crystal 70 and the conducting plane 730 of the adjacent crystals 70. Based on the above explanation, those skilled in the art should be able to deduce other routing methods of the conducting channels and further descriptions are therefore omitted.

Figure 25:
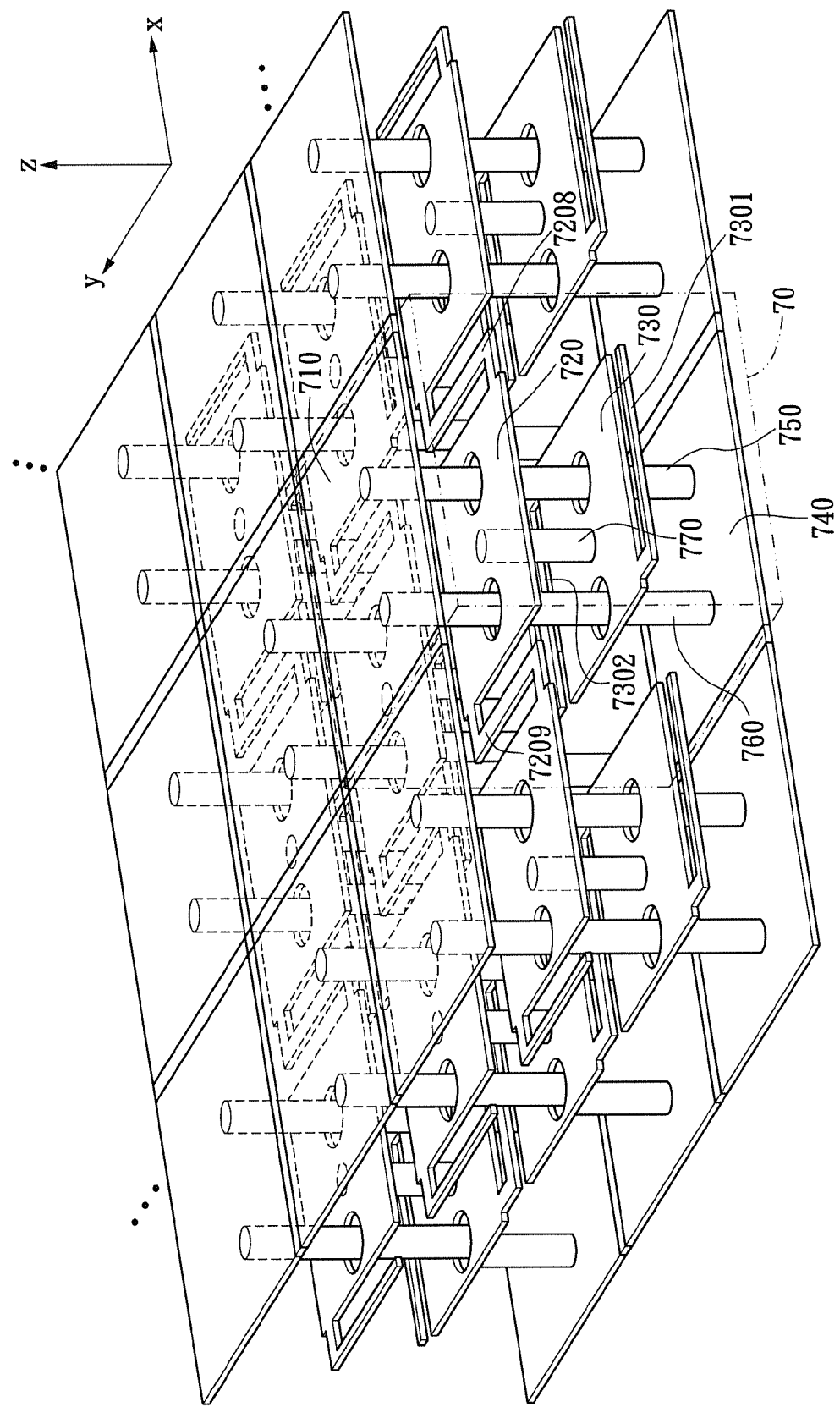
FIG. 25 shows a three-dimensional diagram of a multilayer circuit board structure in accordance to one exemplary embodiment of the present disclosure.
Figure 26:
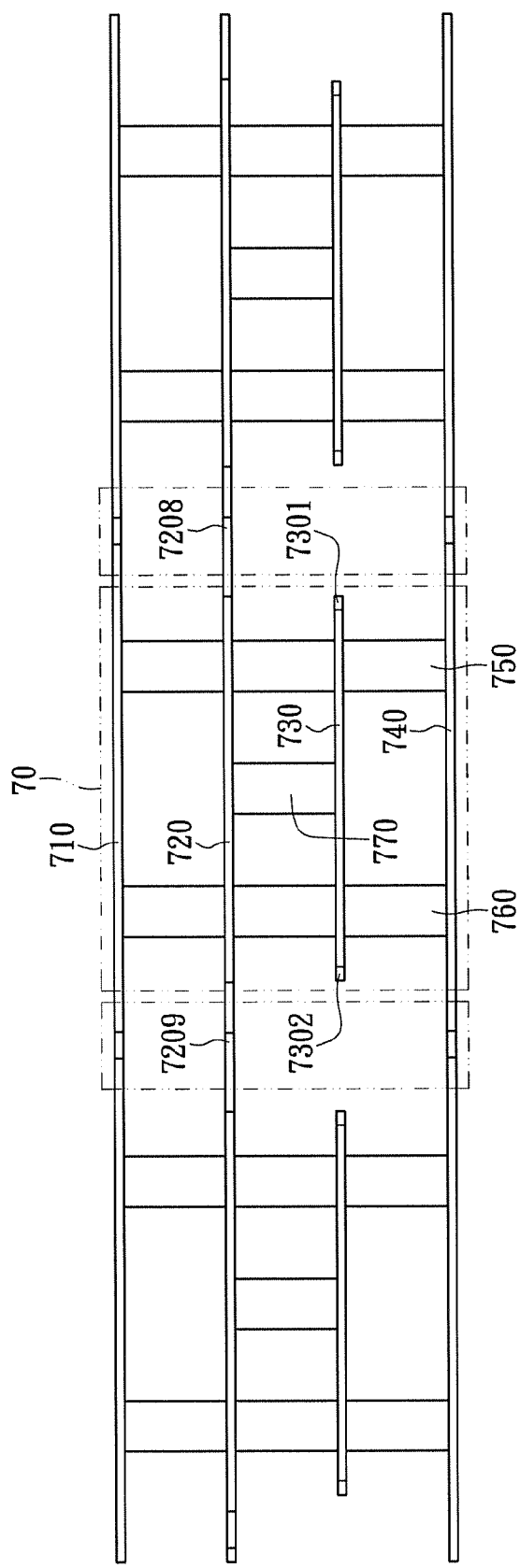
FIG. 26 shows a side view of a multilayer circuit board structure in accordance to the exemplary embodiment of the present disclosure.

Please refer to FIG. 25 in conjunction with FIG. 26, which respectively illustrates a three-dimensional view and a corresponding side view (e.g., viewing along the y-direction) for a multilayer circuit board structure in accordance to the instant exemplary embodiment of the present disclosure. The main difference between the multilayer circuit board structure of FIG. 25 and the multilayer circuit board structure of FIG. 23 is the electrical bridge connection method between the crystals 70 in the multilayer circuit board. As illustrates in FIG. 26, the conducting channels 7208, 7209 electrically connect the coplanar conducting planes 720 of crystals 70 oriented in the horizontal direction or the x-direction. On the other hand, the conducting channels 7301, 7302 electrically connect the coplanar conducting planes 730 of the crystals 70 oriented in the vertical direction or the y-direction.

Alternatively, the conducting channels 7208, 7209 may be disposed between the coplanar conducting planes 720 of crystals 70 in the y-direction while the conducting channels 7301, 7302 may be disposed between the coplanar conducting planes 730 of crystals 70 in the x-direction. In order words, the conducting planes 720, 730 of the crystals 70 are coplanar electrically connect in a chess style. Further as the conducting plane 720 and the conducting plane 730 are electrically connected through the conducting connector 770, consequently Type B electrical plane network associated with the conducting planes 720, 730 may be established.

Consequently, the plurality of the conducting channels 7208, 7209, 7301, 7302 may have different placements as long as the conducting planes of the crystals 70 having the same electrically level can be electrically connected to form the desire electrical plane network. Based on the explanation of the aforementioned exemplary embodiment, those skilled in the art should be able to deduce the other methods for electrical plane connection between crystals using the conducting channels in a multilayer circuit board structure and further descriptions are therefore omitted.

Additionally, the conducting channels 7208, 7209, 7301, 7302 associated with the conducting planes 720, 730 as illustrated take form of a Z-shaped, however, the present disclosure shall not be limited to the example provided herein.

Furthermore, FIG. 19-FIG. 26 only serve as an illustration for describing various shapes, placements, and routing methods which the conducting channels may adopted, therefore, it should be noted that the present disclosure is not limited to FIG. 19-FIG. 26. Furthermore, based on the explanation of the aforementioned exemplary embodiment, those skilled in the art should be able to deduce the other geometric configurations and placements of the conducting channels in the disclosed multilayer circuit board structure and further descriptions are therefore omitted.

(An Exemplary Embodiment of a Multilayer Circuit Board Structure)

Figure 27:
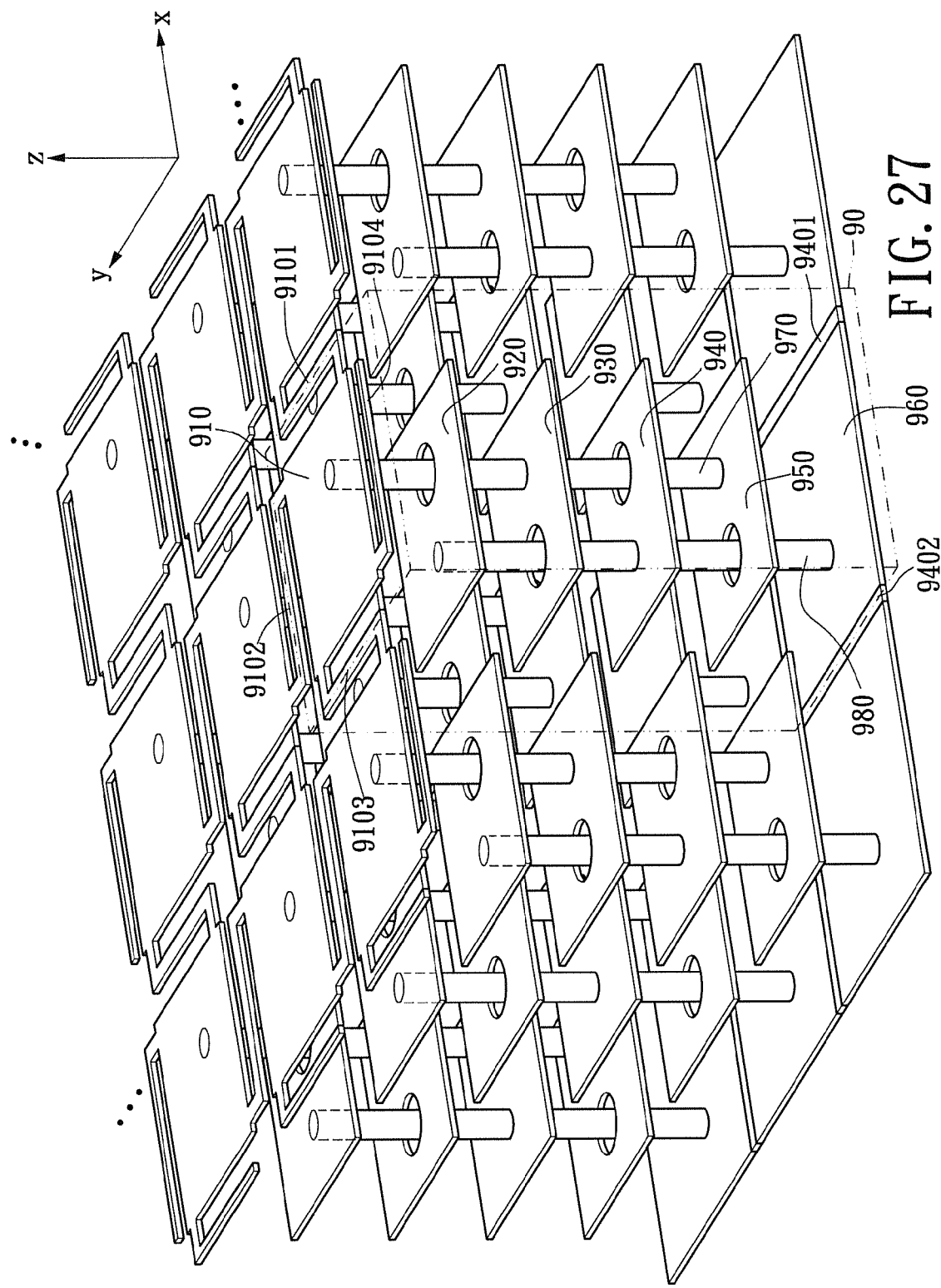
FIG. 27 shows a three-dimensional diagram of a multilayer circuit board structure in accordance to one exemplary embodiment of the present disclosure.
Figure 28:
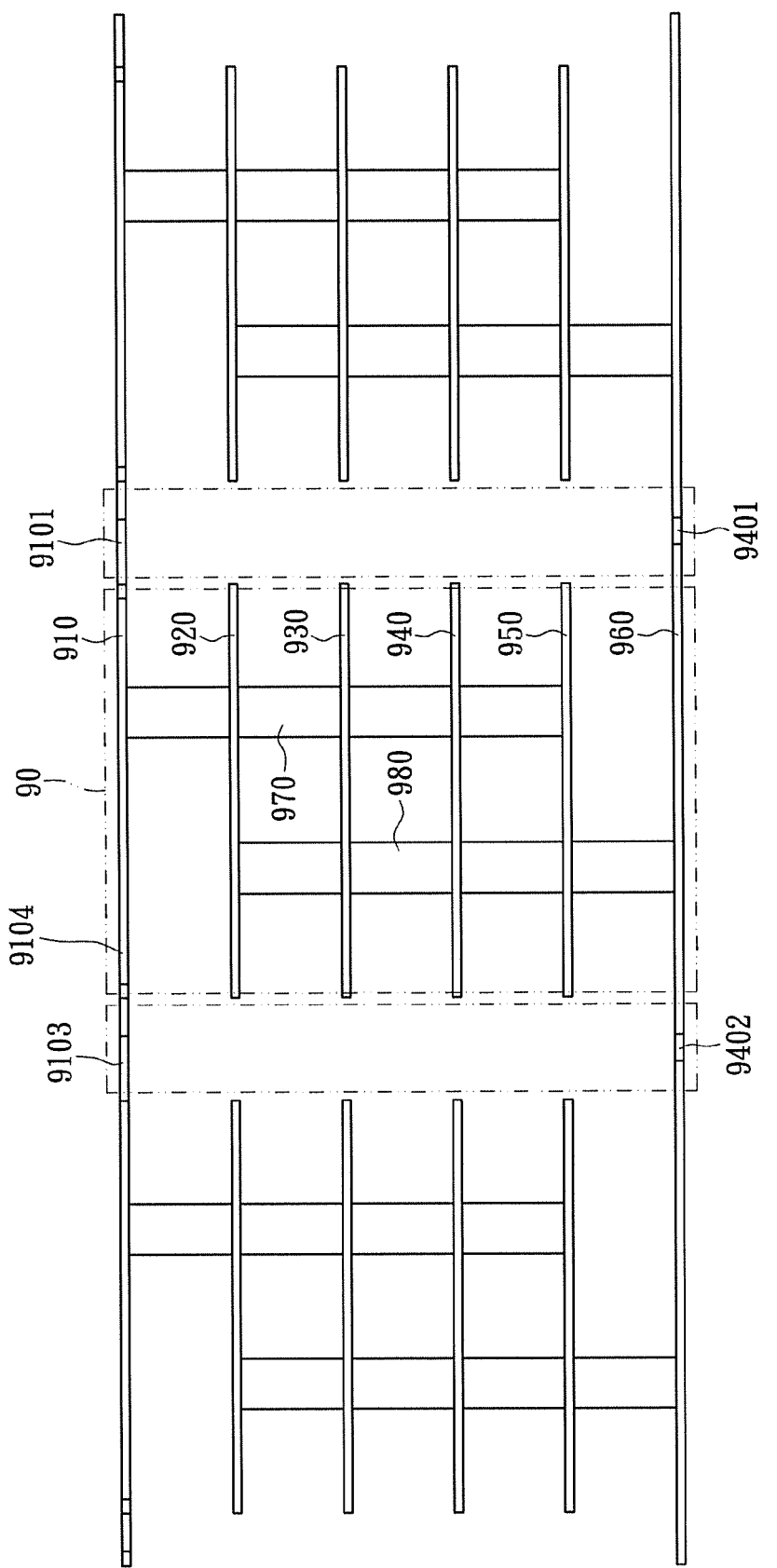
FIG. 28 shows a side view of a multilayer circuit board structure in accordance to the exemplary embodiment of the present disclosure.

Please refer to FIG. 27 in conjunction with FIG. 28, which respectively illustrates a three-dimensional view and a corresponding side view (e.g., viewing along the y-direction) for a multilayer circuit board structure in accordance to the instant exemplary embodiment of the present disclosure.

The concept of the conducting channels may be extended to higher layer circuit board structure. For instance, the multilayer circuit board structure of the FIG. 27 includes a plurality of periodically uniformly disposed crystals 90 (FIG. 13) and a plurality of conducting channels 9101, 9102, 9103, 9104, 9401, 9402.

The conducting channels 9101, 9102, 9103, 9104 which are of Z-shaped and used for connecting between conducting planes 910 of the periodically disposed crystals 90. Specifically, the conducting channels 9101, 9102, 9103, 9104 are disposed to electrically connect the coplanar conducting planes 910 of the crystals 90 to form a Type A electrical plane network. The conducting channels 9401, 9402 which may be conductor plates and are disposed to seal the gap between the coplanar conducting planes 940 of the crystals 90 to form a Type B electrical plane network.

However, it should be noted that FIG. 27 and FIG. 28 only serve as an exemplary illustration. For instance, the Z-shaped conducting channels 9101, 9102, 9103, 9104 may be disposed and routed alternatively to connect the conducting plane 910 to the conducting planes 930 or the conducting planes 950 of the adjacent crystals 90. Likewise the conducting plates shaped conducting channels 9401, 9402 may be disposed and routed alternative to connect the conducting plane 960 to the conducting planes 920 or the conducting planes 940 of the adjacent crystals 90. Similarly, the conducting plane 910 may also be strip-shaped conducting channels as the conducting channels of the conducting plane 960 instead of Z-shaped. Furthermore, the conducting channels 9101, 9102, 9103, 9104, 9401, 9402 may be disposed onto any other conducting planes other than the conducting planes 910, 940 as long as the crystals 90 can be corresponding connected while the conducting planes 910, 930, 960 are electrically isolated from the conducting planes 920, 940, 960, thereby forming two types of electrical plane networks (e.g., power type or ground type plane networks). Or equivalently, at least one of the conducting planes 910, 930, 950 associated with the crystal 90 is electrically connect at least one of the conducting planes 910, 930, 950 associated with at least one adjacent crystal 90 through at least one of the conducting channels 9101, 9102, 9103, 9104, 9401, 9402 to form the Type A electric plane network and at least one of the conducting planes 920, 940, 960 associated with the crystal 90 is electrically connected to at least one of the conducting planes 920, 940, 960 associated with at least one adjacent crystal 90 through at least one of the conducting channels 9101, 9102, 9103, 9104, 9401, 9402 to form the Type A electric plane network. Alternatively, the types, the placements or the quaintly of the conducting channels adopted may vary according to the design and/or fabrication requirement, hence the present disclosure shall not be limited to the multilayer circuit board described in FIG. 27 and FIG. 28.

The geometric configurations and functionality of the crystal 90 are as described in the aforementioned exemplary embodiments, and further descriptions are therefore omitted. Furthermore, based on the above described explanation, those skilled in the art should be able to deduce other geometric extensions crystals and usages of the conducting channels in the multilayer circuit board structure and further descriptions are therefore omitted.

In summary, the present disclosure provides a multilayer circuit board structure, which functions equivalently as a band stop filter and may suppress the undesired electromagnetic wave propagation within a desired frequency band. The geometric properties of the multilayer circuit board structure further may be configured to generate specific stop band bandwidth. For instance, through configuring the placement of the conducting connectors, an upper and/or a lower cutoff frequency of a stop band can be adjusted accordingly. Consequently a stop band bandwidth can be configured. In addition, in comparison to a conventional mushroom shaped EBG structure, the disclosed multilayer circuit board structure provides wider energy bandgap or broader stop band bandwidth while occupies smaller area thereby be a more cost-effective electromagnetic noise blocking solution. Hence the multilayer circuit board structure may be utilized to effectively blocking SSN on parallel power planes when incorporate onto a PCB board or a multilayer package design.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A multilayer circuit board structure, comprising a plurality of crystals and a plurality of conducting channels, wherein each of the crystals comprises:
   at least a first conducting connector;
   at least a second conducting connector; and
   a first through fourth conducting planes, disposed substantially parallel to each other, wherein the first conducting plane is electrically connected to the third conducting plane through the first conducting connector, the fourth conducting plane is electrically connected to the second conducting plane through the second conducting connector, while the first and the third conducting planes are configured to be electrically separated from the second and the fourth conducting planes;
   wherein at least one of the first and the third conducting planes associated with the crystal is electrically connect at least one of the first and the third conducting planes associated with at least one adjacent crystal through at least one of the conducting channels, and at least one of the second and the fourth conducting planes associated with the crystal is electrically connected to at least one of the second and the fourth conducting planes associated with at least one adjacent crystal through at least one of the conducting channels;
   wherein each of the conducting channels comprises a plurality of fold sections.

2. The multilayer circuit board structure according to claim 1, wherein within each of the crystals, the first conducting connector is substantially anchored at center of the third conducting plane, and substantially arranged in the vertical direction of the first and the third conducting planes, and the second conducting connector is substantially anchored at center of the second conducting plane, and substantially arranged in the vertical direction of the second and the fourth conducting planes.

3. The multilayer circuit board structure according to claim 2, wherein the first conducting connector and the second conducting connector forming a pair of conducting connectors in the crystal with a center to center pitch selected to vary a bandwidth of a specific electromagnetic stop band.

4. The multilayer circuit board structure according to claim 3, wherein the pair of conducting connectors is disposed along a diagonal, a horizontal, vertical, or a circular path.

5. The multilayer circuit board structure according to claim 1, wherein the crystals are substantially symmetrical with respect to each other and are substantially periodically distributed in two dimensions to form the multilayer circuit board structure.

6. The multilayer circuit board structure according to claim 1, wherein the plurality conducting channels comprise at least one of a wire or a conducting plate.

7. The multilayer circuit board structure according to claim 1, wherein the radius of the first or the second conducting connector is configured to vary a bandwidth of a specific electromagnetic stop band.

8. The multilayer circuit board structure according to claim 1, wherein the first or the second conducting connector further comprises at least one of a via and a wire.

9. The multilayer circuit board structure according to claim 1, wherein the separations between any adjacent two of the first through fourth conducting planes are configured to vary a bandwidth of a specific electromagnetic stop band.

10. The multilayer circuit board structure according to claim 1, wherein the outline shape dimension of the first conducting plane is substantially larger than the third conducting plane and the fourth conducting plane is substantially larger than the second conducting plane.

11. The multilayer circuit board structure according to claim 1, wherein the first through fourth conducting planes comprise at least a shape in a form of square, hexagonal, triangular, circular, or rectangular.

12. The multilayer circuit board structure according to claim 1, the crystal further comprising:
    a fifth conducting plane, disposed substantially parallel to the third conducting plane, and configured to be electrically separated from the third conducting plane;
    wherein the second and the fourth conducting planes are configured to be electrically connected to the fifth conducting plane through the second conducting connector.

13. The multilayer circuit board structure according to claim 12, the crystal further comprising:
    a sixth conducting plane, disposed substantially parallel to the fifth conducting plane, being configured to be electrically separated from the fifth and the fourth conducting planes;
    wherein, the first and the third conducting planes are configured to be electrically connected to the sixth conducting plane through the first conducting connector.

14. The multilayer circuit board structure according to claim 13, wherein the fifth conducting plane of the crystal is electrically connected to at least one of the second, the fourth and the fifth conducting planes associated with at least one adjacent crystal through at least one of the conducting channels and the sixth conducting plane of the crystal is electrically connected to at least one of the first, the third and the sixth conducting planes associated with at least one adjacent crystal through at least one of the conducting channels.

15. An equivalent parallel plate transmission line circuit comprising:
    a first pair of parallel plate transmission lines;
    a second pair of parallel plate transmission lines; and
    a third pair of parallel plate transmission lines;
    wherein, each of the first through third pairs of parallel plate transmission lines comprises of a first transmission line and a second transmission line, wherein the first and the second transmission lines further comprises a plurality of impedance elements connected in series with each other; wherein the first transmission line of the first pair of parallel plate transmission lines is electrically connected to the second transmission line of the second pair of parallel plate transmission lines through a first inductor, the first transmission line of the second pair of parallel plate transmission lines is electrically connected to the second transmission line of the third pair of parallel plate transmission lines through a second inductor; the second transmission line of the first pair of parallel plate transmission lines is electrically shorted to the first transmission line of the second pair of parallel plate transmission lines and the second transmission line of the second pair of parallel plate transmission lines is electrically shorted to the first transmission line of the third pair of parallel plate transmission lines.

16. The equivalent parallel plate transmission line circuit according to claim 15, wherein the equivalent parallel plate transmission line circuit is a type of band stop filter circuit.

17. The equivalent parallel plate transmission line circuit according to claim 15, wherein the plurality of impedance elements comprises at least one of a plurality of resistance elements and a plurality of reactance elements.

* * * * *